(12) United States Patent
Ooi et al.

(10) Patent No.: US 6,878,562 B2
(45) Date of Patent: Apr. 12, 2005

(54) METHOD FOR SHIFTING THE BANDGAP ENERGY OF A QUANTUM WELL LAYER

(75) Inventors: Boon-Siew Ooi, Pleasanton, CA (US); Seng-Tiong Ho, Wheeling, IL (US)

(73) Assignee: Phosistor Technologies, Incorporated, Pleasanton, CA (US)

( * ) Notice: Subject to any disclaimer, the term of this patent is extended or adjusted under 35 U.S.C. 154(b) by 0 days.

(21) Appl. No.: 09/916,701

(22) Filed: Jul. 26, 2001

(65) Prior Publication Data

US 2002/0072142 A1 Jun. 13, 2002

Related U.S. Application Data

(60) Provisional application No. 60/242,219, filed on Oct. 20, 2000.

(51) Int. Cl.[7] .................. H01L 21/00; H01L 21/265
(52) U.S. Cl. .................. 438/22; 438/36; 438/45
(58) Field of Search .................. 438/22, 24, 36, 438/37, 46, 47, 45

(56) References Cited

U.S. PATENT DOCUMENTS

| | | |
|---|---|---|
| 4,511,408 A | 4/1985 | Holonyak, Jr. |
| 4,771,010 A | 9/1988 | Epler et al. |
| 4,802,182 A | 1/1989 | Thornton et al. |
| 4,824,798 A | 4/1989 | Burnham et al. |
| 4,830,983 A | 5/1989 | Thornton |
| 4,871,690 A * | 10/1989 | Holonaya et al. ............. 438/46 |
| 5,031,185 A | 7/1991 | Murakami et al. |
| 5,145,792 A | 9/1992 | Hirata |
| 5,238,868 A * | 8/1993 | Elman et al. ............. 438/46 |
| 5,276,745 A | 1/1994 | Revelli, Jr. |
| 5,395,793 A | 3/1995 | Charbonneau et al. |
| 5,539,763 A | 7/1996 | Takemi et al. |
| 5,556,804 A | 9/1996 | Nagai |
| 5,707,890 A | 1/1998 | Emery et al. |
| 5,757,023 A * | 5/1998 | Koteles et al. ............. 257/18 |
| 6,027,989 A * | 2/2000 | Poole et al. ............. 438/522 |
| 2002/0127752 A1 * | 9/2002 | Thomson et al. ............. 438/22 |

FOREIGN PATENT DOCUMENTS

EP 0475330 3/1992

OTHER PUBLICATIONS

Lam et al "Plasam immersion Ar ion implantation induced disorder in strained InGaAsP multiple quantum wells" Electronic letters, Apr. 1998 vol. 34 No. 8.*

Poole et al "Bandgap tuning of semiconductor quantum well structures using ion implantation", Sperlattices and Microstructures vol. 15, No. 4 1994.*

Poole, P.J. et al.: "Quantum Well Intermixing For the Realization Of Photonic Integrated Circuits", Proceedings of the SPIE, SPIE, Bellingham, VA, vol. 2613, dated Oct. 24, 1995, pp. 9–16.

(Continued)

*Primary Examiner*—Savitri Mulpuri
(74) *Attorney, Agent, or Firm*—Gray Cary Ware & Freidenrich LLP

(57) ABSTRACT

A process for shifting the bandgap energy of a quantum well layer (e.g., a III–V semiconductor quantum well layer) without inducing complex crystal defects or generating significant free carriers. The process includes introducing ions (e.g., deep-level ion species) into a quantum well structure at an elevated temperature, for example, in the range of from about 200° C. to about 700° C. The quantum well structure that has had ions introduced therein includes an upper barrier layer, a lower barrier layer and a quantum well layer. The quantum well layer is disposed between the upper barrier layer and the lower barrier layer. The quantum well structure is then thermally annealed, thereby inducing quantum well intermixing (QWI) in the quantum well structure and shifting the bandgap energy of the quantum well layer. Also, a photonic device assembly that includes a plurality of operably coupled photonic devices monolithically integrated on a single substrate using the process described above.

36 Claims, 13 Drawing Sheets

OTHER PUBLICATIONS

Zucker, J.E. et al.: "Large Blueshifting Of INGAAS/INP Quantum–Well Band Gaps By Ion Implantation", Applied Physics Letters, American Institute of Physics, New York, vol. 60, No. 24, dated Jun. 15, 1992, pp. 3036–3038.

Tell, B. et al., "Phosphorous Ion Implantation Induced Intermixing of INGAAS–INP Quantum Well Structures", Applied physics Letters, American Institute of physics, New York, vol. 54, No. 16, dated Apr. 17, 1989, pp. 1570–1572.

Ooi, B.S. et al.: The Application Of The Selective Intermixing In Selected Area (SISA) Technique To The Fabrication Of Photonic Devices In GAAS/ALGAAS Structures, International Journal of Optoelectronics, London, GB., vol. 10, No. 4, dated Jul. 1, 1995, pp. 257–263.

Kupka, R.K. et al.: "Gallium–Implantation–Enhanced Intermicing of Close–Surface GAAS/ALAS/ALGAAS Double–Barrier Quantum Wells", Journal of Applied Physics, American Institute of Physics, New York, vol. 78, No. 4, dated Aug. 15, 1995, pp. 2355–2361.

Paquette, M. et al.: "Blueshifting Of INGAAP/INP Laser Diodes By Low–Energy Ion Implantation", Applied Physics Letters, American Institute of Physics, New York, vol 71, No. 26, dated Dec. 29, 1997, pp. 3749–3751.

Yu, S.J. et al.: "Disordering Of INGASS/INP Superlattice And Fabrication Of Quantum Wires By Focused GA Ion Beam", Journal of Vacuum Science and Technology: Part B, American Institute of Physics, New York, vol. 9, No. 5, dated Sep. 1, 1991, pp. 2683–2686.

Copy of the International Search Report from a foreign patent office in a counterpart foreign application.

* cited by examiner

METHOD FOR SHIFTING THE BANDGAP ENERGY OF A QUANTUM WELL LAYER

CROSS-REFERENCES TO RELATED APPLICATIONS

This application claims priority from U.S. provisional application No. 60/242,219, filed Oct. 20, 2000, which is hereby fully incorporated by reference.

BACKGROUND OF THE INVENTION

1. Field of the Invention

The present invention relates, in general, to photonic device manufacturing methods and, in particular, to methods for shifting the bandgap energy of quantum well layers and photonic devices and photonic integrated circuits formed thereby.

2. Description of the Related Art

In the manufacturing of photonic devices, it is often desirable to employ processes that facilitate the monolithic integration of multiple photonic devices on a single substrate. This monolithic integration increases the yield, performance and functionality of the photonic devices and reduces manufacturing cost. The multiple photonic devices can include active photonic devices (e.g., lasers, optical intensity modulators, optical phase modulators, optical switches, optical amplifiers, optical saturable absorbers, optical pulse reconditioners, optical wavelength converters, phosistors [photon transistors], variable optical attenuators, optical detectors) and passive photonic devices (e.g., optical waveguides, optical gratings and optical splitters, optical beam couplers, multi-mode interference devices, optical polarizers, optical polarization beam splitters, optical wavelength filters and optical resonators).

Photonic devices are typically made up of III–V semiconductor materials. Monolithic integration of multiple photonic devices, however, usually requires that photonic devices with different III–V semiconductor material characteristics (e.g., different bandgap energies) be formed on a single substrate. For example, to monolithically integrate a photonic laser device and a passive optical waveguide device, the photonic laser device must contain active III–V semiconductor materials that emit light at a particular lasing wavelength, while the passive optical waveguide device must contain passive III–V semiconductor materials that are transparent to the light emitted from the photonic laser device. Therefore, the emission/absorption wavelength of the III–V semiconductor materials in the photonic laser device must be different from that of the III–V semiconductor materials in the passive optical waveguide device.

The emission/absorption wavelength of III–V semiconductor materials is determined by their bandgap energy. Thus, monolithically integrating multiple photonic devices on a single substrate requires a process for shifting the bandgap energy (and thus the bandgap wavelength) of a selected substrate portion to a value different from that of another substrate portion. Such a process is often referred to as "bandgap engineering."

One approach to bandgap engineering is called "Quantum Well Intermixing (QWI)". Photonic devices typically have a quantum well (QW) structure that includes a quantum well layer disposed between (i.e., sandwiched between) two barrier layers. The barrier layer has a larger bandgap energy than the quantum well layer and acts as a potential barrier to confine electrons in the quantum well layer. QWI shifts the bandgap energy of a quantum well layer in selected areas by intermixing (i.e., interdiffusing) the atoms between the quantum well layer and its adjacent barrier layers.

FIGS. 1A and 1B are energy diagrams for a quantum well structure 10 with a single quantum well layer 12 and barrier layers 14 before and after an exemplary QWI process, respectively. Before the QWI process, barrier layers 14 and quantum well layer 12 have abruptly different transition energies, resulting in a square-shaped finite energy potential well (see FIG. 1A). As is well known to those skilled in the art, such a square-shaped finite energy potential well has a quantitized transition energy (labeled $Eg_{init}$ in FIG. 1A) that is dependent on the thickness of the quantum well layer 12.

During the exemplary QWI process, the square-shaped finite energy potential well structure of FIG. 1A is converted to a parabolic-shaped finite energy potential well structure, as shown in FIG. 1B. Because of the conversion from the square shape to the parabolic shape, the effective thickness of the quantum well layer 12 is modified and typically becomes narrower. This results in a shift in the transition energy $Eg_{init}$ to a new transition energy $Eg_{QWI}$, thus providing the desired shift in bandgap energy and bandgap wavelength.

One conventional QWI process is referred to as Impurity Induced Disordering (IID). This process first involves the creation of crystal site vacancies known as point defects. As is well known to those skilled in the art, the atoms in a semiconductor material form a crystal structure and are arranged in a periodic lattice-like fashion. In the case of III–V semiconductor materials, two types of atoms, namely the group III atoms and the group V atoms, are arranged to occupy alternating lattice sites in the crystal structure. These group III and group V atoms exchange electrons and exist as electrically charged ions at the lattice sites. In the case of Aluminum Gallium Arsenide (AlGaAs), the Al and Ga atoms are from group III and the As atom is from group V. In the case of Indium Gallium Arsenide Phosphide (InGaAsP), the In and Ga atoms are from group III and the As and P atoms are from group V. A "crystal site vacancy" is formed when an ion is missing from a lattice site. Such a crystal site vacancy can be formed, for example, by knocking an ion off its site to an "interstitial space" in the crystal structure. A single isolated vacancy or a small group of vacancies is called a "point defect." A point defect carries the opposite electric charge of the missing ion.

A point defect can move around in the crystal structure when the crystal structure is heated. Heating can cause the atoms in the sample to vibrate violently. Under such thermal vibration, an atom from a lattice site close to the vacancy may move into the vacancy and fill the vacancy (i.e., void). The original site of the atom then forms a new vacancy or point defect, resulting in an effective movement of the point defect from one lattice site to another. Before QWI can happen, point defects are either created at the quantum well structure or migrated to the quantum well structure (for example, to the boundary between a quantum well layer and a barrier layer) via a thermal process.

After the above-mentioned process of having the point defects at the boundary between the quantum well layer and a barrier layer, a subsequent high-temperature crystal annealing step is needed to cause quantum well intermixing (QWI) to occur. Upon high temperature annealing, thermal energy causes some of the point defects in the barrier layer to be filled by atoms from the quantum well layer and the point defects in the quantum well layer to be filled by atoms from the barrier layer. In addition, some of the interstitial atoms with opposite charge will also migrate down to meet with some of the vacancies and heal (i.e., fill) the vacancies. On the other hand, some of the vacancies will migrate deep down to the substrate and become diluted out. In short, this annealing process causes an effective exchange (or "intermixing") of the atoms between the quantum well layer and the barrier layer(s), resulting in a shift of the bandgap energy to a higher value.

More specifically, in a conventional IID process, the creation of the crystal site vacancies (i.e., point defects) is typically accomplished by introducing impurity atoms/ions into the quantum well structure using a room temperature ion-implantation technique. The ion implantation step is followed by a high temperature anneal step, typically conducted at a temperature of around 800° C. for a GaAs and AlGaAs based quantum well structure, or around 600° C. for an InGaAs and InGaAsP based quantum well structure. In such a conventional IID process, donor ion species (e.g., Si) and acceptor ion species (e.g., Zn) have been utilized. These donor and acceptor ion species are known as shallow-level ion species, because they have a relatively low energy of ionization in III–V material semiconductors. During the high temperature anneal step, some of the point defects created by the implanted atoms/ions, the interstitial ions (i.e., those ions knocked from their lattice sites) and the implanted atoms/ions, will diffuse into the quantum well layer and barrier layers and promote intermixing (or interdiffusion) between atoms in the quantum well layer and the barrier layers.

The use of high-energy and/or high dose (i.e., a dose of greater than $1\times10^{15}$ cm$^{-2}$) ion implantation in conventional IID processes is known, however, to cause severe damage in the quantum well structure. The more severe damage includes crystal defects known as loops, lines, complexes and clusters. In general, these crystal defects are referred to as "complex defects."

Conventional ion implantation based IID processes have several drawbacks. These drawbacks include difficulty in producing: (i) a low-loss waveguide photonic device due to free carrier absorption from implanted shallow-level ion species and scattering loss from complex defects induced by the IID process; (ii) photonic devices with controlled electrical characteristics (e.g., a desirable electrical conductivity or pn-junction properties) due to the aforementioned free carriers and complex defects, as well as due to re-distribution of dopants during the high temperature anneal step; and (iii) a photonic device with a high quality gain layer due to the IID process-induced complex defects, which create carrier recombination centers resulting in shorter carrier lifetime and lower optical gain.

Active or passive photonic devices such as amplifiers, lasers, detectors, modulators, couplers, transparent waveguides, and many others, require either good electrical conductivity, low waveguide loss, or high optical gain. The conventional ion implantation based IID processes do not adequately produce high quality photonic devices either in the form of single device or integrated multiple devices.

The main criteria needed for a QWI process to achieve high quality photonic devices can be more specifically described as follows:

(i) The QWI process must be capable of producing low loss passive waveguides with losses of lower than 4 dBcm$^{-1}$.

(ii) The active gain QW structure must not be drastically affected by the QWI process. It is typically desirable to have a gain deterioration after the QWI process of no more than 50% of the original gain value.

(iii) The resolution in the wavelength shift has to be relatively high. A process that can control wavelength shift with a resolution accuracy of better than 10 nm is typically desirable.

(iv) It is desirable to achieve a large enough wavelength shift to produce transparent or low loss passive waveguides. Typically for low loss passive waveguides, it is desirable to have wavelength shift of >100 nm. Another reason for desiring a large wavelength shift is to be able to produce active devices that can operate throughout a large part of the optical communications sub-band. A typical requirement to cover a reasonable part of the optical communications sub-band is to have a wavelength shift of >50 nm.

(v) It is desirable for the process to be capable of producing more than two optical emission/absorption wavelengths on a single substrate (e.g., wafer) so that more than two different types of semiconductor photonic devices can be integrated on a single chip.

(vi) The process must be able to shift the wavelength of QW structures that are placed substantially away from an upper surface, as most of laser and waveguide structures have a relatively thick upper cladding layer. A typical requirement would be the capability of inducing QWI for QW structures that are placed 1.5 $\mu$m away from an upper surface.

(vii) Recently, there has been increasing interest in making small photonic integrated devices monolithically on a single wafer. In order to achieve a high-density of integration, the process must be capable of shifting the optical wavelength with high spatial selectivity (i.e., resolution) on a very small area. This spatial resolution requirement will be dependent on the critical dimensions of the devices. For a conventional device, a typical resolution requirement will be 3–5 $\mu$m. For photonic devices with submicron feature sizes, such as grating or nano-scale photonic devices, the resolution requirement would be less than 3 $\mu$m.

The conventional IID process cannot adequately achieve the majority of criteria (i)–(vii). For example, conventional IID processes can achieve criteria (iii) and (iv), but have difficulty in satisfying criteria (i), (ii), (v) and (vi).

Still needed in the field, therefore, is a method for shifting the bandgap energy of a quantum well layer without inducing complex defects or generating significant free carriers. In addition, the method should avoid the redistribution of dopants into the quantum well layer and satisfy the majority of criteria (i)–(vii) above.

BRIEF SUMMARY OF THE INVENTION

The invention described herein circumvents the various difficulties encountered by the previous methods by the use of a new process referred to as thermally assisted implantation vacancy induced disordering (TAIVID). In processes according to the present invention, disadvantages associated with prior methods are addressed.

The inventive TAIVID process described herein reduces the formation of complex crystal defects in QW structures formed of, for example, III–V semiconductor materials by employing in-situ heating (i.e., an elevated temperature) to spread out the spatial distribution of the point defects created during an ion introduction (e.g., ion implantation) step.

An embodiment of the present invention provides a process for shifting the bandgap energy of a quantum well layer without inducing complex defects or generating significant free carriers. In addition, the process avoids the redistribution of dopants into the quantum well layer. The process includes introducing ions (e.g., deep level ion species) into a QW structure at an elevated temperature typically from about 200° C. to near the crystal damage temperature. The crystal damage temperatures can vary widely depending on the crystal materials. For InP/InGaAsP materials, the crystal damage temperature is at about 750° C. For GaAs/AlGaAs materials, the crystal damage temperature is at about 950° C. The QW structure includes an upper barrier layer, a lower barrier layer and a quantum well layer. The quantum well layer is disposed between the upper barrier layer and the lower barrier layer. The QW structure is then thermally annealed, thereby inducing quantum well intermixing (QWI) in the QW structure and shifting the bandgap energy of the quantum well layer.

In one aspect of the present invention, the in-situ heating is provided with the ions implanted <0.5 µm away from a QW structure. This ion implantation condition is referred to as direct-well implantation and the process is called Direct-Well TAIVID (DW-TAIVID).

In another aspect of the present invention, the in-situ sample heating is performed with the ions being implanted >0.5 µm away from a QW structure. This ion implantation condition is referred to as indirect-well implantation and the process is called Indirect-Well TAIVID (IDW TAIVID). The in-situ heating helps to drive-in the point defects towards the QW structure, which will allow the subsequent QWI to occur at a relatively low ion implantation dose even in the case where the QW structure is located at substantially away from the top wafer surface. The introduction of an implanted impurity >0.5 µm away from the QW structure helps to further reduce the formation of complex crystal defects at the quantum well that can cause damage to the active QW structure layers. Indirect-well implantation can be achieved with relatively low implantation energy so that low-energy implantation equipment can be used, which reduces the cost of the process. Thus, this process permits relatively low ion doses and low implantation energies to be used while still achieving the needed point defect concentration at the quantum well structure so that a high degree of intermixing or wavelength shift (~100 nm or ~60 meV) can occur during a subsequent annealing step.

Indirect-well implantation processes tend to have low spatial resolution as the ions spread (smear) out laterally when migrated to a QW structure. In as yet another aspect of the present invention, the in-situ sample heating is done with a patterned stress-inducing mask on a substrate (e.g., wafer) that includes a QW structure in order to achieve high spatial resolution for the subsequent QWI. The edges of the patterned stress-inducing mask cause material stress in the substrate and form stress field lines oriented in a direction perpendicular to the substrate surface (i.e., the vertical direction). These vertical stress field lines tend to limit the diffusion of point defects horizontally, since it is hard for the point defects to move across the vertical stress field lines. As a result, the vertical stress field reduce the lateral diffusion of point defects during ion implantation, thereby resulting in high spatial resolution for an area-selective wavelength shift.

In as yet another aspect of the present invention, the in-situ sample heating is performed with deep-level ion species, such as As, P, B, F, Xe, Ar and Ga. Deep-level species are not easy to ionize at room temperature and hence will not give rise to much free carriers in III–V semiconductor. This drastically reduces the concentration of free carriers in the material compared to shallow-level species such as Si, Zn, Be, Ge, Sn and S. The reduction of free carrier density with use of deep-level species reduces the optical loss in the waveguides. Thus this embodiment of the present invention provides a process for shifting the bandgap energy of a quantum well layer without inducing complex defects or generating significant free carriers.

In as yet another aspect of the present invention, the TAIVID method is applied to shift the optical wavelength of the QW structure by up to 100 nm with the QW gain deteriorated by less than 50%.

In as yet another aspect of the present invention, the TAIVID method is applied to produce low loss waveguides.

In as yet another aspect of the present invention, the TAIVID method is used to shift two or more different areas on the wafer to several different emission/absorption wavelengths, resulting in a plurality of active and passive photonic devices integrated on a single substrate. The active devices include lasers, optical intensity modulators, optical phase modulators, optical switches, optical amplifiers, optical saturable absorbers, optical pulse reconditioner, optical wavelength converter, phosistors (photon transistors), variable optical attenuators, tunable optical filters or resonators, and optical detectors. The passive optical devices include optical waveguides, optical gratings, optical splitters, optical beam couplers, multimode interference devices, optical polarizer, optical polarization beam splitter, optical wavelength filters, and optical resonators (in the form of ring, disk, race-track, or linear configurations).

In a conventional ion implant based IID process, an ion implantation dose of $1\times10^{15}$ cm$^2$ (i.e., $1\times10^{15}$ number of implanted ions per surface square centimeter) is required to induce the QWI effect. The ions that enter a quantum well structure occupy a region with a thickness of approximately 0.1 micrometer (or $10^{-5}$ cm). This results in a volume concentration of greater than $1\times10^{20}$ cm$^{-3}$ (i.e., greater than $1\times10^{20}$ implanted ions per cubic centimeter). Each ion knocks off approximately one or more atoms from their crystal sites, creating a crystal site vacancy concentration (also referred to simply as "vacancy concentration") of greater than $1\times10^{20}$ cm$^{-3}$ (i.e., greater than $1\times10^{20}$ crystal site vacancies per cubic centimeter). At this crystal site vacancy concentration, it is highly likely for crystal site vacancies to agglomerate together, thereby forming larger aggregates and undesirable complex defects. It has been postulated that such vacancy agglomeration occurs in III–V semiconductor materials at a crystal site vacancy concentration of about $6\times10^{19}$ cm$^{-3}$. That is, when the crystal site vacancy concentration exceeds $6\times10^{19}$ cm$^{-3}$, the aforementioned complex defects will begin to form extensively. Therefore, such a level of crystal site vacancies is referred to as the critical Complex-Defect-Formation (CDF) concentration.

In a process according to one exemplary embodiment of the present invention, the vacancy concentration generated during the ion introduction step (e.g., an ion implantation step) is maintained below the critical CDF concentration by performing the ion implantation at an elevated temperature. Performing the ion implantation with the quantum well structure at an elevated temperature results in thermal diffusion of the crystal site vacancies simultaneously with the generation of additional crystal site vacancies. The crystal site vacancies are, therefore, prevented from reaching the critical CDF concentration, even when ion doses of greater than $1\times10^{15}$ cm$^{-2}$ are employed.

A better understanding of the features and advantages of the present invention will be obtained by reference to the following detailed description that sets forth illustrative embodiments, in which the principles of the invention are utilized, and the accompanying drawings.

DESCRIPTION OF THE SPECIFIC EXEMPLARY EMBODIMENTS

Described herein are various exemplary processes and embodiments of the inventive TAIVID process. The processes can, for example, be used to monolithically integrate various photonic devices on the same substrate (e.g., a wafer), wherein the various photonic devices possess different quantum-well bandgap energies.

To be consistent throughout the present specification and for clear understanding of the present invention, the following definitions are hereby provided for terms used therein:

The term "deep-level ion species" refers to atomic species that are not ionized in III–V semiconductor materials at room temperature; and The term "shallow-level ion species" refers to atomic species that become electrically active at room temperature.

The term "indirect-well implantation" refers to a process which utilizes an implantation condition for which the range of peak impurity and/or vacancy concentration is placed $\geq 0.5$ μm away from a quantum well structure.

The term "direct-well implantation" refers to a process which utilizes an implantation condition for which the range of peak impurity and/or vacancy concentration is placed at $\leq 0.5$ μm away from a quantum well structure.

The term "high spatial resolution" refers to a wavelength shift that affects a lateral area with a resolution smaller than 3 microns.

The term "low spatial resolution" refers to a wavelength shift that affect a lateral area with a resolution larger than 3 microns.

Figure 1A:
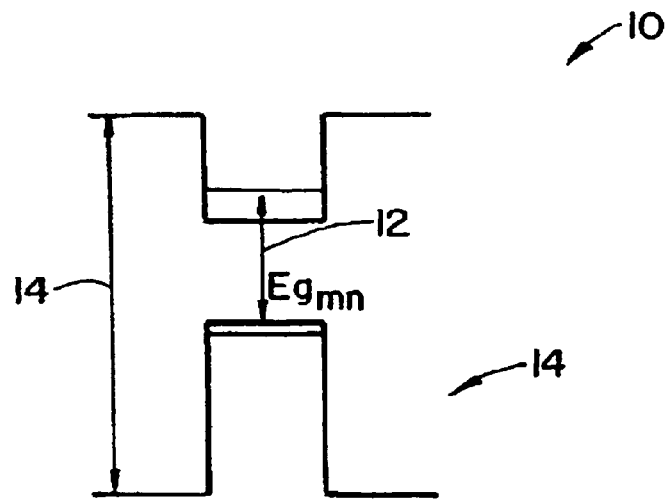
FIGS. 1A and 1B are energy diagrams depicting bandgap energy versus depth for a quantum well structure, before and after quantum well intermixing (QWI), respectively.
Figure 1B:
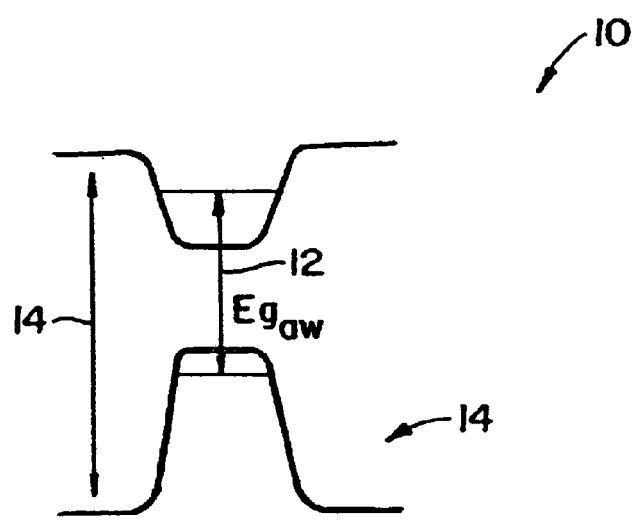
Figure 2:
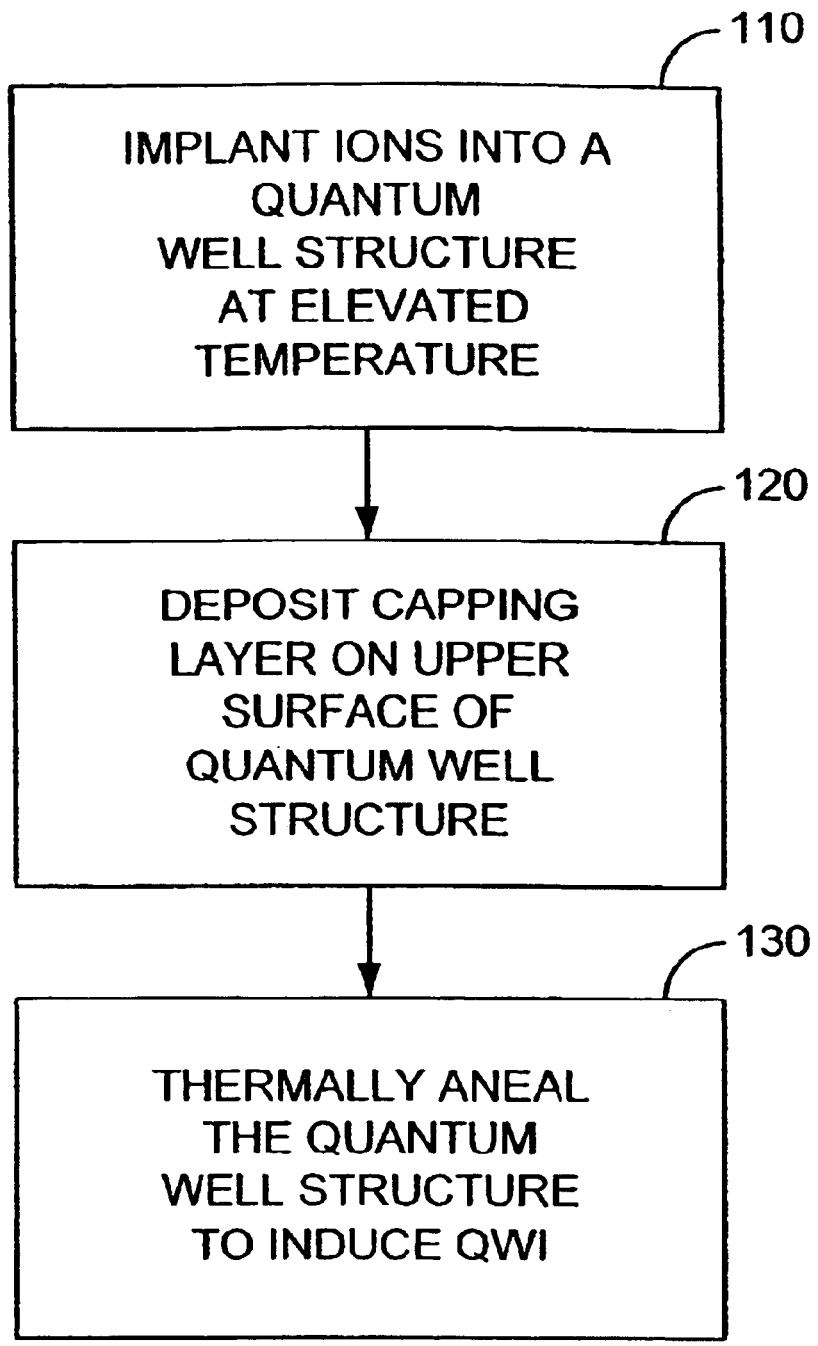
FIG. 2 is a flow diagram illustrating a process in accordance with the present invention.

FIG. 2 illustrates a flow of a process 100 for shifting the bandgap wavelength of a quantum well layer in accordance with one exemplary embodiment of the present invention. Process 100, as shown at step 110 of FIG. 2, as well as in FIG. 3, includes first implanting ions into a quantum well structure 200 at a temperature in the range of from about 200° C. to near the crystal damage temperature of InP/InGaAsP materials at about 750° C.

Quantum well structure 200 includes an upper cladding layer 202, an upper barrier layer 204, a quantum well layer 206 and a lower barrier layer 208. Quantum well layer 206 is disposed between (i.e., sandwiched between) upper barrier layer 204 and the lower barrier layer 208. Upper barrier layer 204, quantum well layer 206 and lower barrier layer 208 can be formed of any suitable III–V semiconductor material known to one skilled in the art. For example, upper barrier layer 204 and lower barrier layer 208 can be formed of InGaAsP (or, alternatively, InP) and quantum well layer 206 can be formed of InGaAs (or, instead, InGaAsP). Alternatively, upper barrier layer 204 and lower barrier layer 208 can be formed of AlGaAs, AlGaInAs, AlGaInP, or GaAsP and quantum well layer 206 can be formed of GaAs, AlGaAs, AlGaInAs, AlGaInP, or GaAsP. In addition, processes in accordance with the present invention can be employed with a quantum well structure that include a plurality of quantum well layers (e.g., five quantum well layers), each sandwiched between two barrier layers.

A typical thickness for quantum well layer 206 is in the range of a few angstroms to about 120 angstroms. A typical thickness for upper barrier layer 204 and lower barrier layer 208 is in the range of a few angstroms to 250 angstroms or thicker.

A primary function of the ion implantation step 110 is to generate point defects in quantum well structure 200. The ion species used in ion implantation step 110 can be any suitable shallow-level ion species (e.g., Si, Zn, Be, Ge, Sn and S) or deep-level ion species (e.g., B, F, Ga, As, P, Xe, N, O and Ar) known to one skilled in the art. However, since deep-level ion species are not easily ionized at room temperature, their use provides the additional benefit of reducing the free carrier concentration in quantum well structure 200, in comparison to the use of shallow-level ion species. Further, such a reduction of free carrier concentration with the use of deep-level ion species also lowers optical loss in waveguides manufactured from quantum well structure 200.

Arsenic (As), gallium (Ga), phosphorus (P) and Xenon (Xe) are especially beneficial deep-level ion species for use in process 100. Arsenic and phosphorus are matrix elements of III–V semiconductor materials and are expected to recombine with other constituent elements in quantum well structure 200 to form part of the lattice during a subsequent thermal annealing step. Arsenic, gallium and phosphorus are also expected to carry no charge state and, therefore, not to contribute to undesirable free carrier absorption at room temperature. Xenon is also especially beneficial since it has a relatively large atomic mass (i.e., 132) and is, therefore, expected to exhibit a low lateral straggle length (i.e., lateral penetration into the substrate) during ion implantation step 110 and to create a high concentration of point defects. In addition, since the diffusion coefficients of As, P and Xe in III–V semiconductor materials are relatively low, ion diffusion induced QWI in the undesirable lateral direction is expected to be minimal.

Figure 4:
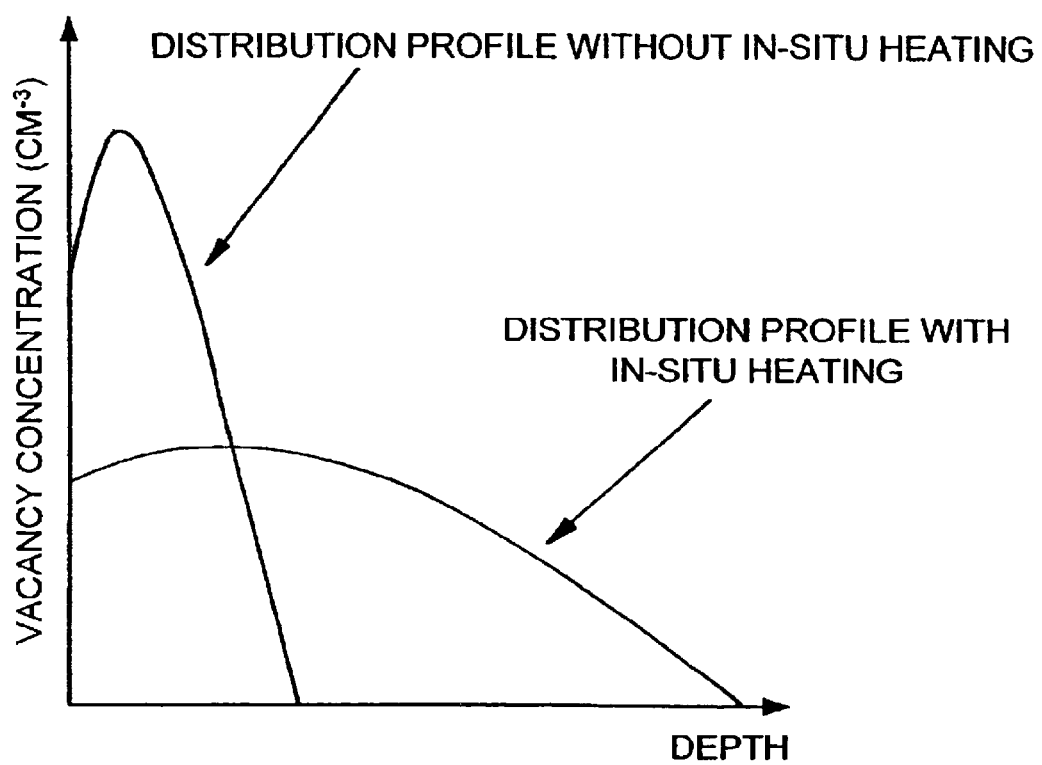
FIG. 4 is a graph of vacancy concentration versus depth in a quantum well structure for crystal site vacancies created by ion implantation at room temperature (i.e., without in-situ heating) and crystal site vacancies created with in-situ heating according to one exemplary embodiment of the present invention.

Ion implantation step 110 is conducted at a temperature of from about 200° C. to about 500° C. which is near the damage temperature of 750° C., in order to spread out the spatial distribution of point defects generated during the ion implantation. FIG. 4 graphically illustrates such a spreading of the spatial distribution, namely vacancy concentration versus depth in a quantum well structure for crystal site vacancies created by ion implantation at room temperature (i.e., without in-situ heating) and crystal site vacancies created with in-situ heating according to one exemplary embodiment of the present invention. As a result of this spreading of the spatial distribution, the point defect concentration is maintained below the critical CDF concentration for the formation of complex defects. The avoidance of such complex defects helps to reduce optical loss and gain deterioration in the quantum well structure.

In addition to avoiding the formation of complex defects, the in-situ heating serves to diffuse point defects closer to quantum well layer 206. As a result, such in-situ heating provides a reduction of the ion dose and implantation energy needed to induce QWI in the subsequent thermal anneal step. An in-situ heating temperature of approximately 200° C. is close to the minimum temperature needed to impart enough energy to cause substantial thermal diffusion of the point defects. The upper temperature limit of in-situ heating is dependent on the temperature at which the III–V semiconductor material begins to thermally decompose. For InP/InGaAs/InGaAsP type materials, the decomposition occur at around 750° C. For GaAs/AlAs/AlGaAs type materials, the decomposition occur at around 950° C.

Ion implantation step 110 can employ an ion dose in the range of $1\times10^{11}$ cm$^{-2}$ to greater than $1\times10^{15}$ cm$^{-2}$ and an implantation energy in the range of about 1 eV to 3 MeV. However, since in-situ heating is used during the ion implantation step, relatively low ion doses (e.g., less than $1\times10^{14}$ cm$^{-2}$) and low implantation energies (e.g., equal to or less than 400 KeV) can be used, while still achieving a point defect concentration near the quantum well layer that enables a high degree of QWI (i.e., intermixing that produces a bandgap energy shift of 60 meV, which is equivalent to a bandgap wavelength shift of 100 nm). The use of lower ion doses and implantation energies also serves to further reduce the formation of complex defects that can affect the electronic properties (e.g., current injection) and optical properties (e.g., gain/luminescence) of the quantum well layer. Furthermore, since in-situ heating is used during the ion implantation step, relatively high ion doses (e.g., greater than $1\times10^{14}$ cm$^{-2}$) can be used, while still maintaining the vacancy concentration generated during the ion implantation step below the critical CDF concentration.

Once apprised of the current disclosure, one of skill in the art will recognize that the introduction of ions is not limited to the above described ion implantation but can be accomplished via a focused ion beam or a dense ion-plasma above a substrate (e.g., a wafer). A focused ion beam can be furnished by those skilled in the art using a focused ion beam machine, and a dense plasma can be furnished by those skilled in the art using an inductively-coupled plasma (ICP) machine, a reactive-ion-etching (RIE) machine, or a plasma-enhanced chemical vapor deposition (PECVD) machine. One of skill in the art will also recognize that the temperature range of in-situ hating may be away from the preferred range describe here, for example at below 200° C. such as at low as 150° C., depending on the material structures and the degree of diffusion desired for the point defects. The reduced effect at lower temperature can also be compensated via other means, for example, via using a longer heating and implantation time.

Next, at step 120 of FIG. 2, a capping layer is deposited on quantum well structure 200. The capping layer can be formed of silicon dioxide ($SiO_2$) or any other material that prevents the loss of group V elements from quantum well structure 200. A typical thickness for a $SiO_2$ capping layer is approximately 200 nm.

Next, the quantum well structure 200 is subjected to thermal annealing to initiate QWI. The thermal annealing step heats the quantum well structure up to a temperature $T_{anneal}$ within an initiation time $t_{init}$ and maintains the quantum well structure at or around that temperature for an annealing time $t_{anneal}$ and then cools the quantum well structure down to room temperature within a cooling time $t_{cooling}$. The temperature may take step wise or arbitrarily changing profiles during $t_{init}$ or $t_{cooling}$ or $t_{anneal}$, though a steadily raising profile to a near constant $T_{anneal}$ and a steadily cooling profile to room temperature is typically used. The thermal annealing may be performed by an electric oven or by a rapid thermal processor (RTP) or any other heating instruments.

The thermal annealing step can be done in an inert environment such as in a nitrogen environment. For the purpose of illustration and not limitation, the thermal annealing step can last for a period of several minutes to tens of seconds. A shorter thermal annealing time has the benefit of reducing surface decomposition. The annealing temperature $T_{anneal}$ is dependent on the actual material composition but can be predetermined by one of skill in the art after a careful study of the thermal stability of the material, i.e. the critical annealing temperature $T_{critical}$ at which an as-grown, unprocessed substrate with quantum wells would experience a significant wavelength shift, thereby indicating thermal-induced sample damage. This critical annealing temperature $T_{critical}$ is also somewhat dependent on the annealing time $t_{anneal}$. For the purpose of illustration and not limitation, $T_{anneal}$ is often at a value within 400° C. below $T_{critical}$. For the purpose of illustration and not limitation, for InGaAsP materials, $T_{anneal}$ is higher than 450° C. and lower than 750° C. and $T_{critical}$ is around 750° C.

The thermal annealing step can be performed using a rapid thermal processor (RTP) in a nitrogen atmosphere. As is well known to those skilled in the art, an RTP includes a chamber filled with halogen lamps. The halogen lamps can heat up the quantum well structure very rapidly to high temperature, which will minimize thermal damage to the quantum well structure due to thermally induced material decomposition.

In an RTP-based thermal annealing process, $t_{init}$ is only a few seconds and $t_{cooling}$ achieves a significant temperature drop by more than 100° C., also within a few seconds.

During high temperature annealing, surface point defects generated ion implantation will either relax at a surface or indiffuse into a QW structure. As described above, as the point defects indiffuse into the QW structure, some of the point defects in the barrier layer will be filled by atoms from the quantum well layer and some of the point defects in the quantum well layer will be filled by atoms from the barrier layer. Such interdiffusion between the atoms of QW layer and barrier layer, referred to as the quantum-well-intermixing (QWI) effect, will result in energy bandgap or emission wavelength shift for the QW layer.

Figure 3:
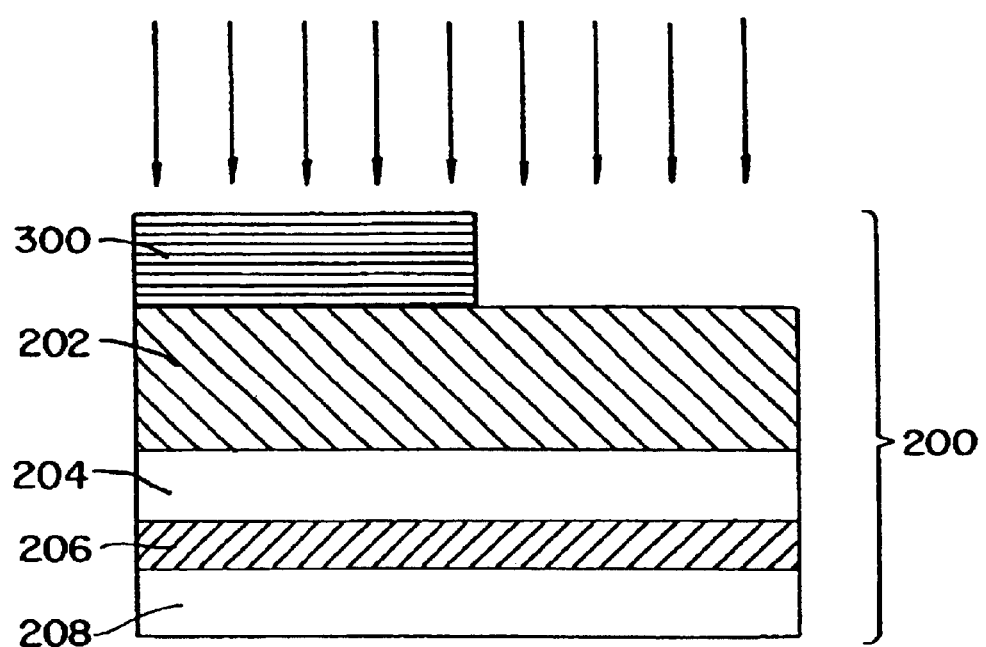
FIG. 3 is a cross-sectional view illustrating the ion implantation step in the process of FIG. 2 with arrows indicating the direction of ion implantation.

In the exemplary process of FIG. 2, the quantum well structure 200 of FIG. 3 is thermally annealed to induce quantum well intermixing (QWI) and to thereby shift the bandgap energy of the quantum well layer, as illustrated at step 130 of FIG. 2. The thermal annealing step can be conducted at a temperature above 450° C. for a time period in the range of around 2 seconds to around 3 minutes in a rapid thermal processor. The annealing temperature is dependent on the material composition of the quantum well structure. For purposes of illustration and not limitation, the annealing temperature can be from 450° C. and around 750° C. for InGaAsP-based quantum well structures, while it can be from 600° C. and around 950° C. for AlGaAs-based quantum well structures.

In a process according to another exemplary embodiment of the present invention, the ion implantation step described above is conducted using a patterned mask layer formed on the quantum well structure. The patterned mask layer can include a plurality of patterned mask layer portions, each of a different thickness. In this manner, the patterned mask layer 300 in FIG. 3 can serve as an implant mask, with the patterned mask layer portions either completely blocking ions from penetrating into the quantum well structure or limiting the degree, to which ions penetrate into the quantum well structure. By predetermining the thickness of the patterned mask layer portions, one can also control the amount of impurity ions implanted into the quantum well structure and thus control the degree of bandgap energy shift. The use of a patterned mask layer, therefore, provides for different bandgap energy shifts in different portions of a quantum well structure and enables the monolithic integration of multiple photonic devices possessing different bandgap energies.

Patterned mask layer 300 in FIG. 3 can be formed of silicon dioxide ($SiO_2$), or any other material that prevents the penetration of ions into the quantum well structure, such as silicon nitride, aluminum, titanium, nickel, chromium, photoresist, polymer, PMMA (poly-methyl methalchrorate), zinc oxides, strontium fluoride, metals or semiconductors, using conventional deposition, photolithographic and etching techniques. The thickness of patterned mask layer is dependent on the mass of the ion being implanted and the degree of desired penetration of the ion into quantum well structure, but can be, for example, 400 nm for a $SiO_2$ patterned mask layer.

In another exemplary embodiment of a process according to the present invention. A patterned stress-inducing mask layer is used during the ion implantation step. The use of such a patterned stress-inducing mask layer enables a process with improved spatial resolution. In this process, the material of the patterned stress-inducing mask layer is predetermined to be a material that has a significant difference in thermal expansion coefficient from the quantum well structure material (i.e., substrate material) that the patterned stress-inducing mask layer is formed on.

The difference in thermal expansion coefficient will allow significant stress to be created to form a vertical stress field lines that will aid in guiding the migration of point defects to the quantum well structure during the thermal annealing step. The vertical stress field lines enable the achievement of high spatial resolution so that an area of bandgap energy shift is located within 3 microns of a boundary defined by an edge of the patterned stress-inducing mask layer. For the purpose of illustration and not limitation, the material of the patterned stress-inducing mask layer can be silicon dioxide, high stress silicon nitride, and other insulators, metals, or semiconductor materials that can form high stress field lines at the boundary defined by an edge of the stress-inducing patterned mask layer. For example, silicon dioxide can be employed as the material of the patterned stress-inducing mask layer since silicon dioxide has a thermal expansion coefficient that is more than 10 times different than that of typical III–V semiconductor materials.

To demonstrate the bandgap wavelength shifting behavior and other benefits of processes in accordance with exemplary embodiments of the present invention the following experiments were conducted:

First the quantum well structure detailed in Table 1 below was formed. This quantum well structure includes a InGaAs/InGaAsP/InP quantum well core (i.e., a p-i-n waveguide core) with five unintentionally doped 85 Å $In_{0.53}Ga_{0.47}As$ quantum well (QW) layers and six 120 Å $In_{0.7}Ga_{0.3}As_{0.5}P_{0.5}$ barrier layers ($\lambda_g$=1.30 μm). This is a lattice-matched unstrained system. As is well known to those skilled in the art, for the lattice-matched III–V quaternary alloy $In_xGa_{1-x}As_yP_{1-y}$, x and y are completely specified by the alloy's bandgap wavelength. Hence, the bandgap wavelength has been used to specify the material's composition. The five QW layers are active layers that can emit or absorb light energy. The peak emission wavelength of the active quantum well layers, measured from photoluminescence at room temperature, was at approximately 1.560 μm.

The above-described QW core was surrounded above and below by a graded index (GRIN) transition region made up of gradually changing layers of InGaAsP. The upper GRIN region is followed above by an upper cladding layer, while the lower GRIN structure is followed below by a lower cladding layer. The bandgap wavelengths of these GRIN regions are gradually varied between that of the barrier material at the edge of the waveguide core (e.g., $\lambda_g$=1.20 μm) and that of the waveguide cladding (e.g., $\lambda_g$=1.00 μm). Specifically, the layers in the GRIN structures from the waveguide core are: 500 Å (e.g., $\lambda_g$=1.20 μm), 400 Å (e.g., $\lambda_g$=1.10 μm) and 800 Å (e.g., $\lambda_g$=1.00 μm). The thickness of the InP lower cladding is 1 μm and that of the upper cladding is 1.5 μm.

The top GRIN structure was left unintentionally doped and the lower GRIN structure was n-doped with Si to a dopant concentration of n=5×10$^{17}$ cm$^{-3}$. The lower cladding is n-doped with a dopant concentration of n=2×10$^{18}$ cm$^{-3}$ and the upper cladding is p-doped with a dopant concentration of p=2×10$^{18}$ cm$^{-3}$. The contact layers are formed of a p$^+$-type 500 Å $In_{0.8}Ga_{0.2}As_{0.4}P_{0.6}$ buffer layer (e.g., 5×10$^{18}$ cm$^{-3}$) and a p$^+$-type 0.1 μm $In_{0.53}Ga_{0.47}As$ contact layer (e.g., 1×10$^{19}$ cm$^{-2}$). Silicon was used as the n-dopant and zinc as the p-dopant.

The quantum well layers, barrier layers, GRIN layers and cladding layers were formed on the (100)-oriented n$^+$-type S-doped InP substrate with an etch pit density of less than 500 cm$^2$ using metal-organic chemical vapor deposition (MOCVD).

TABLE 1

| Thickness (Å) | Material | Dopant | Concentration cm$^{-3}$ | Remark |
|---|---|---|---|---|
| 1000 | $In_{0.53}Ga_{0.47}As$ | Zinc | p = 1 × 10$^{19}$ | Contact |
| 500 | $In_{0.8}Ga_{0.2}As_{0.4}P_{0.6}$ | Zinc | P = 5 × 10$^{18}$ | Contact buffer |
| 15000 | InP | Zinc | p = 2 × 10$^{18}$ | Upper cladding |
| 800 | InGaAsP ($\lambda_g$ = 1.00 μm) | — | Intrinsic | GRIN |
| 400 | InGaAsP ($\lambda_g$ = 1.10 μm) | — | Intrinsic | GRIN |
| 500 | InGaAsP ($\lambda_g$ = 1.20 μm) | — | Intrinsic | GRIN |
| 120 | $In_{0.7}Ga_{0.3}As_{0.5}P_{0.5}$ ($\lambda_g$ = 1.30 μm) | — | Intrinsic | Barrier |
| 85 | $In_{0.53}Ga_{0.47}As$ | — | Intrinsic | 1$^{st}$ QW |
| 120 | $In_{0.7}Ga_{0.3}As_{0.5}P_{0.5}$ ($\lambda_g$ = 1.30 μm) | — | Intrinsic | Barrier |
| 85 | $In_{0.53}Ga_{0.47}As$ | — | Intrinsic | 2$^{nd}$ QW |

TABLE 1-continued

| Thickness (Å) | Material | Dopant | Concentration cm$^{-3}$ | Remark |
|---|---|---|---|---|
| 120 | In$_{0.7}$Ga$_{0.3}$As$_{0.5}$P$_{0.5}$ ($\lambda_g$ 1.30 μm) | — | Intrinsic | Barrier |
| 85 | In$_{0.53}$Ga$_{0.47}$As | — | Intrinsic | 3$^{rd}$ QW |
| 120 | In$_{0.7}$Ga$_{0.3}$As$_{0.5}$P$_{0.5}$ ($\lambda_g$ = 1.30 μm) | — | Intrinsic | Barrier |
| 85 | In$_{0.53}$Ga$_{0.47}$As | — | Intrinsic | 4$^{th}$ QW |
| 120 | In$_{0.7}$Ga$_{0.3}$As$_{0.5}$P$_{0.5}$ ($\lambda_g$ = 1.30 μm) | — | Intrinsic | Barrier |
| 85 | In$_{0.53}$Ga$_{0.47}$As | — | Intrinsic | 5$^{th}$ QW |
| 120 | In$_{0.7}$Ga$_{0.3}$As$_{0.5}$P$_{0.5}$ ($\lambda_g$ 1.30 μm) | — | Intrinsic | Barrier |
| 500 | InGaAsP ($\lambda_g$ = 1.20 μm) | Silicon | n = 5 × 10$^{17}$ | GRIN |
| 400 | InGaAsP ($\lambda_g$ = 1.10 μm) | Silicon | n = 5 × 10$^{17}$ | GRIN |
| 800 | InGaAsP ($\lambda_g$ = 1.00 μm) | Silicon | n = 5 × 10$^{17}$ | GRIN |
| 10000 | InP | Silicon | n = 2 × 10$^{18}$ | Buffer |
| — | InP | Sulpher | | Substrate |

Next, two sets, with five samples each, were implanted at room temperature using 360 keV arsenic (As) and implantation doses of 1×10$^{12}$ cm$^{-2}$, 1×10$^{13}$ cm$^{-2}$, 5×10$^{13}$ cm$^{-2}$, 1×10$^{14}$ cm$^{-2}$ and 5×10$^{14}$ cm$^{-2}$, which corresponds to peak crystal site vacancy concentrations of 2×10$^{20}$ cm$^{-3}$, 2×10$^{21}$ cm$^{-3}$, 1×10$^{22}$ cm$^{-3}$, 2×10$^{22}$ cm$^{-3}$ and 1×10$^{23}$ cm$^{-3}$, respectively. In addition, two other sets, with five samples each, were implanted using similar ion implantation conditions, except that the ion implantation was carried out at a temperature of 200±20° C. Each of the samples was tilted to an angle of 7° during ion implantation to minimize ion channeling and to improve the controllability and spatial resolution of the ion implantation process.

Based on theoretical simulations, the 360 keV arsenic (As) ion implantation step generated vacancies (i.e., point defects) at a depth extending up to about 0.2 μm from the surface. The ion implantation at 360 keV, therefore, only generated relatively shallow point defects in the implanted material and, thus, produced no direct damage to the QW layers, which are located greater than 1.5 μm below the surface.

After the ion implantation step, a 200 nm SiO$_2$ capping layer was deposited on the samples using a plasma enhanced chemical vapor deposition (PECVD) technique. The original implant mask could be striped away or left on before this capping layer deposition. In a preferred embodiment, the original mask is stripped away using wet etching. This SiO$_2$ capping layer acted as an annealing cap to protect the surface of the QW structure from being depleted of Group V elements during the subsequent high temperature annealing step.

Next, a thermal annealing step was carried out at 650° C. for 90 seconds using a rapid thermal processor (RTP) in a nitrogen atmosphere. Prior to annealing, the samples were placed face down on a piece of fresh GaAs and another fresh piece of GaAs was placed over the back of the samples to provide an arsenic (As) overpressure environment during the thermal annealing step. This serves to further protect the surface of the QW structure by minimizing diffusion of As and P out of the QW structure. During this thermal annealing step, the point defects generated during ion implantation either relaxed at the surface, or diffused further into the QW structure. It is known by those skilled in the art that the diffusion of point defects into the QW layers will enhance diffusion between (i.e., "inter-diffusion" of) the atoms of the QW layers and the barrier layers, and thus induce quantum well intermixing (QWI).

Figure 5:
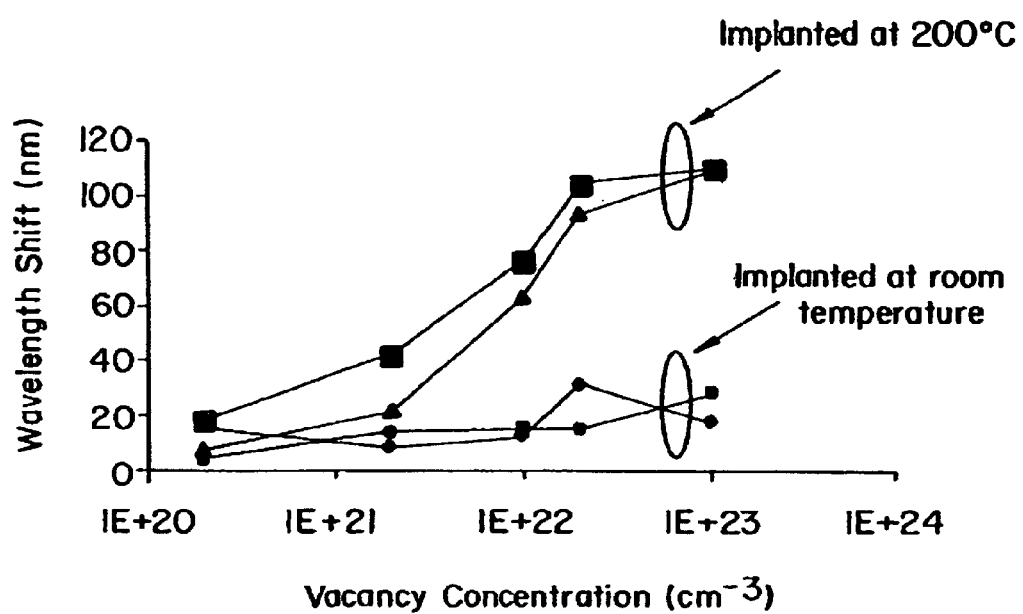
FIG. 5 is a graph of wavelength shift versus vacancy concentration (calculated for samples implanted at room temperature) for Table 1 samples implanted at 200° C. and Table 1 samples implanted at room temperature.

Photoluminescence (PL) measurements performed at 77° K. were subsequently carried out to determine the induced wavelength shift. With reference to FIG. 5, it is observed that samples implanted at elevated temperature (i.e., 200° C. ±20° C.) show a significant bandgap wavelength shift (i.e., bandgap energy shift) beyond a room temperature threshold crystal site vacancy concentration of 1×10$^{21}$ cm$^{-3}$. The degree of intermixing appears to saturate at a room temperature crystal site vacancy concentration of 1×10$^{23}$ cm$^{-3}$. The samples implanted at room temperature, however, show insignificant bandgap wavelength shifts across the range of crystal site vacancy concentrations studied in this experiment, as illustrated in FIG. 5.

To recapitulate, in this experiment, selected samples were heated to 200±20° C. during implantation, in order to diffuse the crystal site vacancies deeper into the QW structure region or to relax them at the surface. This "in-situ" heating during the ion implantation step serves to keep the point defect concentration (i.e., vacancy concentration) below the critical concentration necessary for the formation of thermally stable vacancy complexes. FIG. 4 shows that instead of creating a vacancy concentration depth profile centered at 0.2 μm as would occur with a conventional room temperature ion implantation step, a nearly constant vacancy concentration through the 1.5 micron thick upper cladding layers is resulted for the samples implanted at 200° C. Vacancies below the critical concentration for complex formation (i.e., greater than 6×10 cm$^{-3}$) are relatively mobile at 200° C., resulting in the large wavelength shift (i.e., large degree of quantum well intermixing) observed in FIG. 5.

For the samples implanted at room temperature, vacancy agglomerations and complexes would to occur close to the QW structure surface (i.e., centered around 0.2 μm from the wafer surface). These complexes will coalesce into extended defects during the thermal annealing step and trap point defects, thereby preventing them from migrating to the quantum well during the thermal annealing step, which explains why only very slight bandgap energy shifts are observed from samples implanted at room temperature (see FIG. 5).

As another exemplary process demonstration, the effect of a patterned stress-inducing mask layer was investigated. InGaAs/InGaAsP/InP MQWs laser structure samples similar to those described in Table 1 were prepared. These samples were then deposited with a 1 μm thick SiO$_2$ layer using PECVD. A patterned stress-inducing mask layer was formed from the 1 micron thick SiO$_2$ layer using photolithography and reactive ion etching. Subsequent sample treatment for this experiment was done with the steps described above within the described process parameter ranges. For example, the implantation step was performed with As-implantation at 360 keV and 1×10$^{14}$ cm$^{-2}$ dose, and an implantation temperature of 200±20° C. During ion implantation, the samples were tilted by 7° to avoid ion channelling. Simulation results indicate that the 360 keV ion implantation drove the ions to an average range of 0.2 μm. At this implantation energy the arsenic ions will not penetrate through 1 μm of SiO$_2$.

A fresh 200 nm SiO$_2$ capping mask was deposited on the samples using PECVD prior to rapid thermal annealing. This fresh SiO$_2$ capping mask, covering the entire wafer, acted as the annealing mask during a subsequent RTP-based thermal annealing step. In the RTP thermal annealing chamber, the samples were placed face down on a piece of fresh GaAs and another piece of GaAs was placed over the back to provide arsenic overpressure during annealing, hence further protecting the surface by minimizing the outdiffusion of arsenic. An annealing temperature of 650° C. for 90 seconds was used in this experiment.

To investigate the spatial resolution of the exemplary process, micro PL spectra were taken in by scanning the wafer with a step size of 2.5 µm using an excitation source. An Nd:YAG laser operating at a wavelength of 1.06 µm, with a spot diameter or <1 µm was used as the excitation source. A sharp transition from the quantum well emission at an interface between implanted and un-implanted regions of the wafer was observed. The un-implanted (i.e. masked) region gave a PL peak at 1.55 µm as would be given by an as-grown sample, whereas the implanted region was shifted to about 1.42 µm. This result indicates that a spatial resolution of better than 2.5 µm can be obtained from an indirect well implantation method using a patterned stress-inducing mask layer.

The above exemplary embodiment illustrates the case where the in-situ sample heating is performed with indirect well implantation and good spatial resolution in spite of the deeply-located QW structures. In-situ heating was done with a patterned stress-inducing mask layer on the wafer (i.e., on a substrate that includes a quantum well structure) in order to achieve high spatial resolution for the QWI. The edges of the dielectric mask cause material stress in the wafer and form vertical stress field lines oriented in the direction perpendicular to the wafer surface (called the vertical direction). These vertical stress field lines tend to limit the diffusion of point defects horizontally, since it is difficult for the point defects to move across the vertical stress field lines. As a result, the vertical stress field lines reduce the lateral diffusion of the point defect during the ion implantation, thereby resulting in high spatial resolution for an area-selective wavelength shift.

It is well known to those skilled in the art that high mobility dopants, especially zinc (Zn, a p-dopant) and beryllium (Be, a p-dopant), diffuse and re-distribute significantly during high temperature annealing. The mobility of these dopants are ~$5 \times 10^{17}$ cm$^{-2}$ s$^{-1}$ in III–V semiconductor materials at a temperature of ~650° C., which is within the thermal annealing temperature needed to induce quantum well intermixing (QWI). The diffusion of such high mobility dopants into the QW layer results in an undesirable increase in the optical absorption of the QW structure. In addition, the diffusion of such high mobility dopants can cause an unwanted QWI effect in portions of the QW structure where no QWI effect is desired.

In a process according to yet another exemplary embodiment of the present invention, this issue is addressed by implanting ions into a QW structure that includes a layer doped with a high mobility impurity that is back-spaced by equal to or greater than 0.1 µm from the QW layers and barrier layers. In this respect, the "high mobility impurity" is defined as a shallow-level impurity that diffuses interstitially in an InGaAs and InGaAsP based semiconductor material with a diffusivity equal to or greater than $5 \times 10^{17}$ cm$^{-2}$ s$^{-1}$ at an annealing temperature of equal to or greater than 650° C. By back-spacing the layer doped with a high mobility impurity, diffusion of the high mobility impurity into the QW layer, and subsequent degradation of the QW layer's optical and electrical properties, is avoided.

To demonstrate the benefits of having layers doped with a high mobility impurity layer back-spaced from the QW and barrier layers, the following experiment was conducted:

First, InGaAs/InGaAsP/InP laser quantum well structures with a single quantum well layer were grown using metal-organic chemical vapor deposition (MOCVD). The InGaAs/InGaAsP/InP laser quantum well structures (each referred to as sample type A or Sample A) are described in Table 1 and each has a single 75 Å $In_{0.53}Ga_{0.47}As$ quantum well layer sandwiched between two 120 Å $In_{0.7}Ga_{0.3}As_{0.5}P_{0.5}$ barrier layers ($\lambda_g$=1.30 µm) In each of Sample A, the high mobility impurity layer is back-spaced from the quantum well layer and barrier layers by 1700 angstroms.

Next, samples with another InGaAs/InGaAsP/InP laser quantum well structure with a single quantum well layer was grown using metal-organic chemical vapor deposition (MOCVD). The structures (each referred to as sample type B or Sample B) have two top GRIN regions doped with Zn to a concentration of $5 \times 10^{17}$ cm$^{-3}$, thereby forming a high mobility impurity layer that is not back-spaced from the barrier layers and quantum well layer. The comparison of the doping concentrations between Sample A and Sample B is given in Table 2.

TABLE 2

| Thickness (Å) | Material | Sample A | Sample B |
|---|---|---|---|
| 1000 | $In_{0.53}Ga_{0.47}As$ | p = 1 × 10$^{19}$ cm$^{-3}$ (Zinc) | p = 1 × 10$^{19}$ cm$^{-3}$ (Zinc) |
| 500 | $In_{0.8}Ga_{0.2}As_{0.4}P_{0.6}$ | p = 5 × 10$^{18}$ cm$^{-3}$ (Zinc) | p = 5 × 10$^{18}$ cm$^{-3}$ (Zinc) |
| 15000 | InP | p = 2 × 10$^{18}$ cm$^{-3}$ (Zinc) | p = 2 × 10$^{18}$ cm$^{-3}$ (Zinc) |
| 800 | InGaAsP ($\lambda_g$ = 1.00 µm) | Intrinsic | p = 5 × 10$^{17}$ cm$^{-3}$ (Zinc) |
| 400 | InGaAsP ($\lambda_g$ = 1.10 µm) | Intrinsic | p = 5 × 10$^{17}$ cm$^{-3}$ (Zinc) |
| 500 | InGaAsP ($\lambda_g$ = 1.20 µm) | Intrinsic | p = 5 × 10$^{17}$ cm$^{-3}$ (Zinc) |
| 120 | $In_{0.7}Ga_{0.3}As_{0.5}P_{0.5}$ ($\lambda_g$ = 1.30 µm) | Intrinsic | Intrinsic |
| 75 | $In_{0.53}Ga_{0.47}As$ | Intrinsic | Intrinsic |
| 120 | $In_{0.7}Ga_{0.3}As_{0.5}P_{0.5}$ ($\lambda_g$ = 1.30 µm) | Intrinsic | Intrinsic |
| 500 | InGaAsP ($\lambda_g$ = 1.20 µm) | n = 5 × 10$^{17}$ cm$^{-3}$ (Silicon) | n = 5 × 10$^{17}$ cm$^{-3}$ (Silicon) |
| 400 | InGaAsP ($\lambda_g$ = 1.10 µm) | n = 5 × 10$^{17}$ cm$^{-3}$ (Silicon) | n = 5 × 10$^{17}$ cm$^{-3}$ (Silicon) |
| 800 | InGaAsP ($\lambda_g$ = 1.00 µm) | n = 5 × 10$^{17}$ cm$^{-3}$ (Silicon) | n = 5 × 10$^{17}$ cm$^{-3}$ (Silicon) |
| 10000 | InP | n = 2 × 10$^{18}$ cm$^{-3}$ (Silicon) | n = 2 × 10$^{18}$ cm$^{-3}$ (Silicon) |
| — | InP | Sulpher | Sulpher |

Oxide stripe broad area gain-guided lasers with a pumping window of 75 μm were fabricated from Samples A and B that had not been subjected to intermixing ("as-grown"), as well as Samples A and B that had been subjected to an intermixing process. The intermixing process was carried out by implanting the samples with $5 \times 10^{13}$ cm$^{-2}$ dose of 360 keV Arsenic at a temperature of 200° C., followed by thermally annealing of the samples using a rapid thermal processor at 675° C. for 60 seconds under an N$_2$ and As-overpressure ambient.

The 77K PL peaks shifted from 1.440 μm for the as-grown sample A to about 1.360 μm for the Sample A subjected to the intermixing process. The 77K PL shift was from 1.430 m to about 1.335 μm for the as-grown Sample B and Sample B subjected to the intermixing process, respectively.

Figure 6:
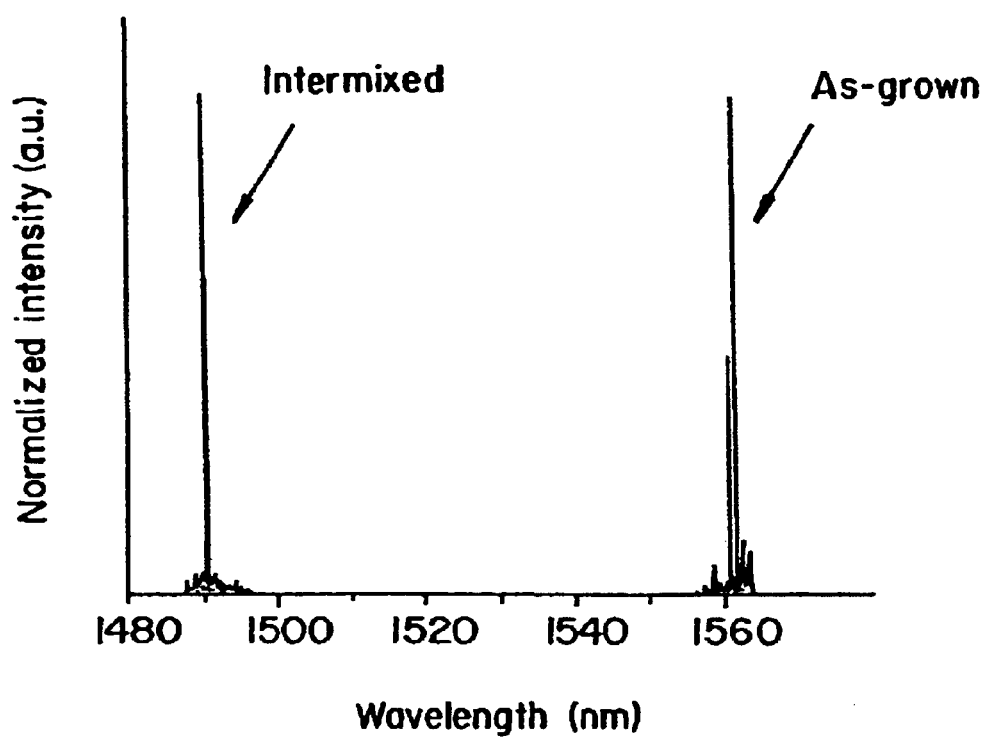
FIG. 6 is a graph of wavelength intensity versus wavelength for as-grown and intermixed samples of Table 2.

The samples were subsequently cleaved into various laser cavity lengths for testing. Results of the testing showed that photonic laser devices fabricated from both as-grown in Sample A and as-grown Sample B give similar light-current curves. It was measured that lasers fabricated using the as-grown Sample A and Sample B give a threshold current densities of 1.11 KAcm$^{-2}$ and 1.10 KAcm$^{-2}$, respectively, for 500 μm cavity length lasers. However, an attempt to fabricate photonic laser devices from Sample B that has been subjected to the intermixing process failed, such an attempt to fabricate photonic laser devices from the Sample A that has been subjected to the intermixing process was successful. Spectral measurement on the photonic laser devices fabricated from Sample A that has been subjected to the intermixing process show that the lasing wavelength had shifted from 1.560 μm to about 1.490 μm (see FIG. 6), which is a similar shift observed from the PL measurements.

The above results imply that for Sample B, Zn may have diffused from the GRIN regions into the barrier and/or quantum well layers and altered the carrier confinement properties of these layers. These layers may have been converted to p-type and, therefore, experienced no injected current. In short, the photonic laser devices fabricated from Sample B that has been subjected to the intermixing process failed because diffusion of the Zn separated the region of light generation from the guiding region, making stimulated recombination impossible.

Figure 7:
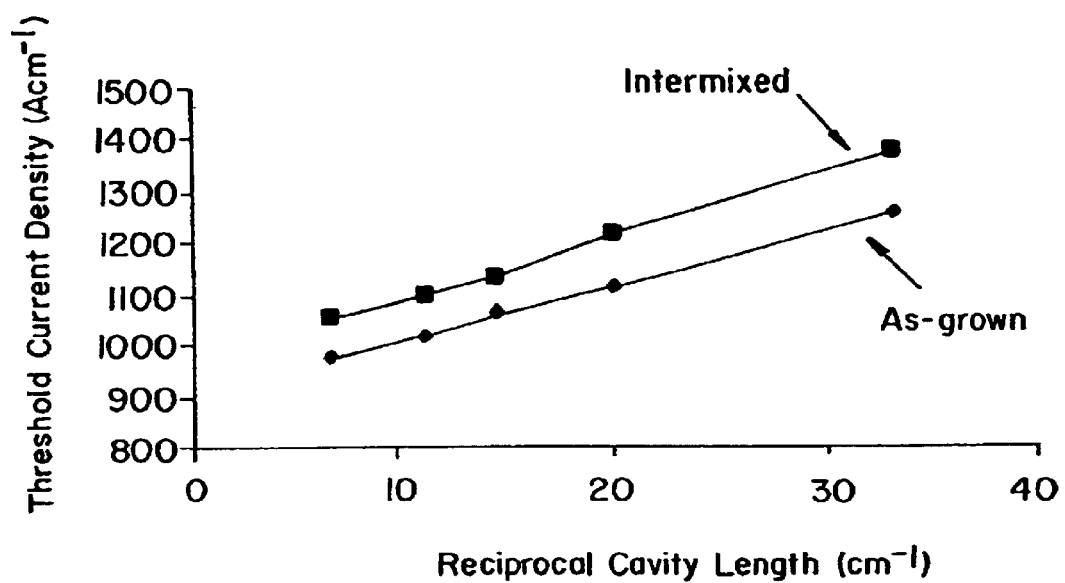
FIG. 7 is a graph of threshold current density versus reciprocal cavity length for intermixed and as-grown samples of Table 2.

The devices from the as-grown and intermixed Sample A were tested for threshold current and slope efficiency. FIG. 7 graphically shows two sets of threshold data plotted as threshold current density against reciprocal cavity length. The slope of this graph is related to the gain of the quantum well structures and shows no significant change on annealing of the samples. The slope efficiency data showed little change with disordering within the variability of the measurement. This indicates that the intracavity optical gain had not been changed significantly and that the internal quantum efficiency remained high.

Once apprised of the present disclosure, one skilled in the art will recognize that processes in accordance with exemplary embodiments of the present invention can be used to monolithically integrate multiple photonic devices on a single substrate (i.e., to form a photonic device assembly that includes a plurality of operably coupled photonic devices on a single substrate) by shifting the bandgap energy of a quantum well layer(s) formed on two or more portions of the substrate. One skilled in the art will also recognize that, in such a photonic device assembly, the induced bandgap energy shift need not be identical for each of the multiple photonic devices.

A result when the current processes are utilized in the manufacturing of photonic devices can, therefore, be a plurality of active and/or passive photonic devices monolithically integrated on a single substrate. The active devices can include, for example, lasers, optical intensity modulators, optical phase modulators, optical switches, optical amplifiers, optical saturable absorbers, optical pulse reconditioner, optical wavelength converter, phosistors (photon transistors), variable optical attenuators, tunable filter or resonator, and optical detectors. The passive optical devices include optical waveguides, optical gratings, optical splitters, optical beam couplers, multi-mode interference devices, optical polarizer, optical polarization beam splitter, optical wavelength filters, and optical resonators (in the form of ring, disks or linear configurations).

A photonic device assembly according to one exemplary embodiment of the present invention includes a low-loss waveguide, a 1×2 multi-mode interference coupler, an optical amplifier and an optical modulator. The low-loss waveguide, 1×2 multi-mode interference coupler, optical amplifier and optical modulator are operably coupled such that the assembly functions as a 1×2 optical switch. To function properly as a 1×2 optical switch, the bandgap energies of the low-loss waveguide, optical amplifier and optical modulator must be distinctly different from one another. For example, the optical amplifier can have a bandgap energy that provides peak absorption near that of an input wavelength, the low-loss waveguide can have a bandgap energy significantly higher than that of the optical amplifier and the optical modulator can have a bandgap energy between the bandgap energy of the optical amplifier and the bandgap energy of the low-loss waveguide. These distinctly different bandgap energies can be provided by the inventive methods described above.

To further demonstrate the versatility and benefits of processes according to the present invention, five further exemplary embodiments utilizing various aspects of the invention are described in detail below.

A. First Exemplary Process Embodiment Using Low Energy Ion Implantation

In this first exemplary process embodiment, the TAIVID method is applied with indirect-well implantation. The first exemplary process involves:

(Step 1) Provision of a Wafer (i.e., Substrate) Including a Quantum Well Structure.

Figure 8A:
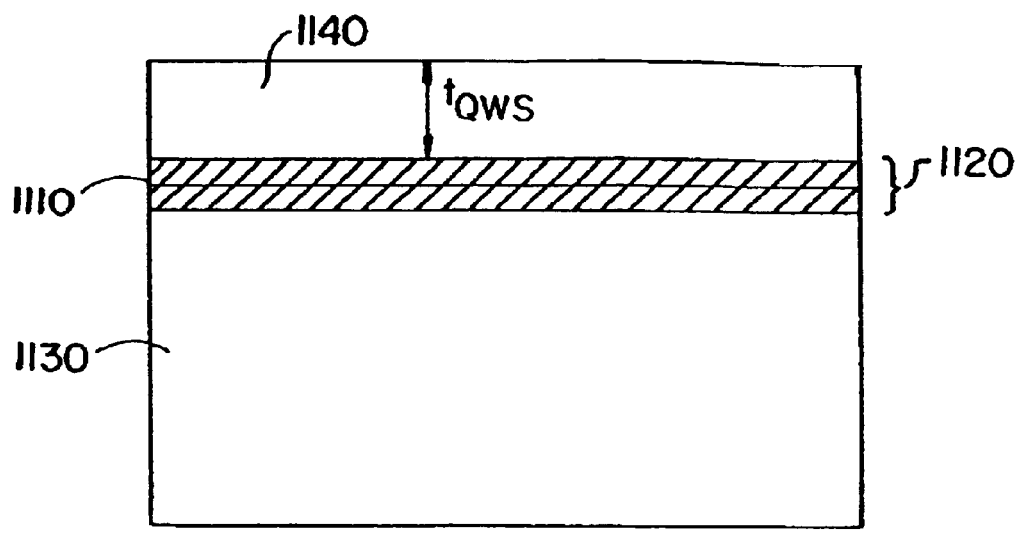
FIGS. 8A–8B illustrate stages in an exemplary process according to the present invention.

First, a sample made up of multi-layer III–V semiconductor materials is provided. As shown in FIG. 8A, the multi-layer III–V semiconductor material sample has at least one quantum well 1110 (forming a part of quantum well structure 1120) grown on top of a substrate (e.g., a wafer) 1130. Quantum well 1110 possesses a particular quantum well bandgap energy $E_{QW}$ (or quantum well wavelength $\lambda_{QW}$). As illustrated in FIG. 8, the quantum well structure 1120 is located at a certain distance $t_{QWS}$ away from a wafer surface 1140.

The multi-layer III–V semiconductor material sample can be, for example, the active medium for a semiconductor laser, for which the quantum well structure is placed approximately 1.5 μm away from the wafer surface. Therefore, in this first exemplary process embodiment, $t_{QWS}$ is 1.5 μm. More specifically, the III–V semiconductor material sample includes a InGaAs/InGaAsP/InP multiple quantum well structure. The III–V semiconductor materials were grown using metal-organic chemical vapor deposition (MOCVD) on a (100)-oriented n$^+$-type S-doped InP substrate. The InGaAs/InGaAsP/InP waveguide core consisted of a structure of five 85 Å In$_{0.53}$Ga$_{0.47}$As quantum well layers and six 120 Å In$_{0.7}$Ga$_{0.3}$As$_{0.5}$P$_{0.5}$ barrier layers ($\lambda_g$=1.30 μm). The five quantum well layers are active quantum wells that emit or absorb light energy. The peak emission wavelength of the active quantum well layers, measured from photoluminescence at room temperature, is at approximately $\lambda_{QW}$=560 µm.

The InGaAs/InGaAsP/InP III–V semiconductor materials are lattice-matched to the InP substrate and are unstrained. As is well know to those skilled in the arts, for a lattice matched III–V quarternary alloy $In_xGa_{1-x}As_yP_{1-y}$, the compositions x and y needed to achieve lattice matching are uniquely determined given the bandgap wavelength. Hence, specifying the bandgap wavelength is equivalent to specifying the material composition, which is a fact that will be used below.

The above-mentioned quantum well layers and barrier layers were surrounded above and below by an upper cladding layer and a lower cladding layer, respectively. Specifically, the upper cladding layer was made up of 500 Å thick InGaAsP ($\lambda_g$=1.20 µm), 400 Å ($\lambda_g$=11.0 µm) and 800 Å thick InGaAsP ($\lambda_g$=1.00 µm) followed by a 15000 Å thick InP. The lower cladding layer was made up of 500 Å thick InGaAsP ($\lambda_g$=1.20 µm), 400 Å ($\lambda_g$=1.10 µm) and 800 Å thick InGaAsP ($\lambda_g$=1.00 µm) on top of InP substrate. The details of the structure are given in Table 3.

TABLE 3

| Thickness (Å) | Material | Remark |
| --- | --- | --- |
| 5000 | InP | Upper cladding |
| 800 | InGaAsP ($\lambda_g$ = 1.00 µm) | Upper GRIN |
| 400 | InGaAsP ($\lambda_g$ = 1.10 µm) | Upper GRIN |
| 500 | InGaAsP ($\lambda_g$ = 1.20 µm) | Upper GRIN |
| 120 | $In_{0.7}Ga_{0.3}As_{0.5}P_{0.5}$ ($\lambda_g$ = 1.30 µm) | Barrier |
| 85 | $In_{0.53}Ga_{0.47}As$ | 1st QW |
| 120 | $In_{0.7}Ga_{0.3}As_{0.5}P_{0.5}$ ($\lambda g$ = 1.30 µm) | Barrier |
| 85 | $In_{0.53}Ga_{0.47}As$ | 2nd QW |
| 20 | $In_{0.7}Ga_{0.3}As_{0.5}P_{0.5}$ ($\lambda_g$ = 1.30 µm) | Barrier |
| 85 | $In_{0.53}Ga_{0.47}As$ | 3rd QW |
| 120 | $In_{0.7}Ga_{0.3}As_{0.5}P_{0.5}$ ($\lambda_g$ = 1.30 µm) | Barrier |
| 85 | $In_{0.53}Ga_{0.47}As$ | 4th QW |
| 120 | $In_{0.7}Ga_{0.3}As_{0.5}P_{0.5}$ ($\lambda_g$ = 1.30 µm) | Barrier |
| 85 | $In_{0.53}Ga_{0.47}As$ | 5th QW |
| 120 | $In_{0.7}Ga_{0.3}As_{0.5}P_{0.5}$ ($\lambda_g$ = 1.30 µm) | Barrier |
| 500 | InGaAsP ($\lambda_g$ = 1.20 µm) | Lower GRIN |
| 400 | InGaAsP ($\lambda_g$ = 1.10 µm) | Lower GRIN |
| 800 | InGaAsP ($\lambda_g$ = 1.00 µm) | Lower GRIN |

As is well known to those skilled in the art, there are many other variations of quantum well structures and many variations of III–V semiconductor materials that can be used to make such quantum well structures. For the purpose of illustration and not limitation, the III–V semiconductor materials can be made up from material systems that include, but are not limited to, GaAs/AlGaAs, InGaAs/InGaAsP/InP, GaP, AlGaP, InAlGaP or InAlGaAs III–V semiconductor material systems. As is also well known to those skilled in the art, the quantum well structure can be placed at various distances from the substrate (e.g., wafer) surface.

(Step 2) Patterned Layer Formation on the Substrate

Figure 8B:
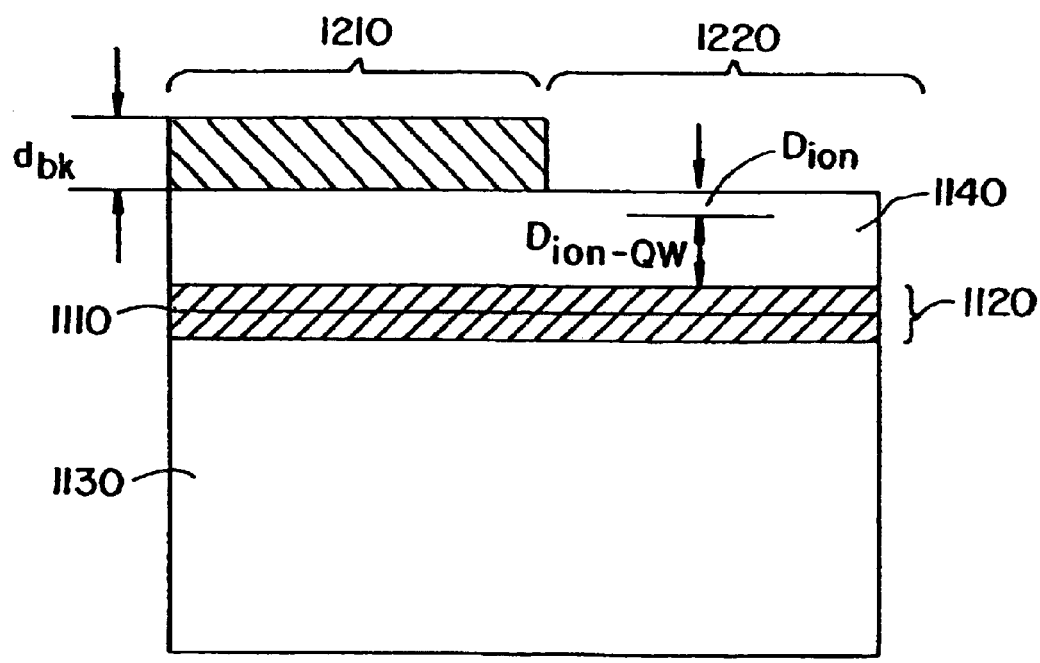

A thin layer of blocking material (i.e., a patterned mask layer) 1200 is formed to a thickness $d_{bk}$ on a certain part of the substrate (e.g., wafer) called the blocked area 1210, as shown in FIG. 8B, and either not on a certain other part (or formed to a much thinner thickness $d_{unbk}$ on this other part) called the unblocked area 1220 in FIG. 8B. The blocking material "mask" is needed to provide a wavelength shift on the unblocked area of the wafer but not on the blocked area of the wafer. Any suitable material can be used as the blocking material, as long as the material can be deposited on top of surface 1140 and with a thickness $d_{bk}$ that is thick enough to block the penetration of ions. This blocking materials can, for example, be silicon dioxide, silicon nitride, aluminum, titanium, nickel, chromium, photoresistant, polymer, PMMA, zinc oxides, strontium fluoride, other insulators, metals or semiconductor materials.

Thickness $d_{unbk}$ is thin enough to allow a predetermined penetration of ions. By varying the thickness of $d_{unbk}$, one can control the amount of ions introduced (e.g., implanted) into the unblocked area 1220. As the amount of wavelength shift is a function of the amount of ions implanted into the sample, controlling the thickness of $d_{unbk}$ controls the amount of wavelength shift. A wafer can have no blocking material thereon at all, in which case the entire wafer can experience a wavelength shift. Alternatively, a wafer can have two or more unblocked areas with different thicknesses of the blocking materials to result in different wavelength shifts on different unblocked areas using a single ion implantation process. This enables the simultaneous fabrication of different photonic devices that can operate at different wavelengths or with different functionalities on a single substrate with a single ion-implantation process. Furthermore, these different photonic devices can be operatively connected on a single wafer to form a photonic integrated circuit.

As an exemplary patterned mask layer, the exemplary wafer structure is deposited with a $d_{bk}$=400 nm thick $SiO_2$ layer using plasma enhanced chemical vapor deposition (PECVD) on the blocked area 1210 in FIG. 8B, and with a $d_{unbk}$=0 nm thick $SiO_2$ (i.e. with no $SiO_2$ layer.) layer on the unblocked area 1220 in FIG. 8B. The value of $d_{bk}$=400 nm and $d_{unbk}$=0 nm are for the purpose of illustration and not limitation. For example, $d_{bk}$ can be larger than about 400 nm, and $d_{unbk}$ can be non-zero but smaller than about 400 nm.

(Step 3) Ion Introduction using Indirect-Well Implantation

Next, at step 3, ions are introduced to an average depth of $D_{ion}$ from the wafer surface and at a distance of $D_{ion-QW}$ from the top of quantum well structure 1120. For the indirect-well implantation considered here, $D_{in-QW}$ is larger than 0.5 µm.

The ions can, for example, be introduced using ion implantation. In an ion-implanter as is well known to those skilled in the art, the ions pass through a mass separating analyzer magnet that eliminates unwanted ion species. The selected ions then enter the acceleration tube and are accelerated to high energies by an electrical field. The accelerated ions pass through the vertical and horizontal scanners and are implanted into a substrate. As is well known to those skilled in the art, the depth of implantation is dependent on the ion implantation species and the ion implantation energy, and can be predicted using well-known methods. In the first exemplary process embodiment, the implantation energy is predetermined to achieve the required implantation depth $D_{ion}$.

The sample is then heated to a temperature of $T_{implant}$ for at least part of the duration of the ion implantation process given by the ion-implantation heating time $t_{implant-heat}$. For example, $T_{implant}$ is larger than about 200° C. and smaller than about 500° C. for the case of a sample that includes InGaAsP/InP materials. This temperature range is dependent on the material composition. The temperature range is limited, therefore, not by a single absolute value but by the material decomposition temperature as the upper limit. Therefore, the elevated temperature used during the ion implantation process (or other ion introduction technique) step in processes according to the present invention can be outside of the about 200° C. to about 500° C. range noted above.

The implanted ion dose is the ion-beam current density (current per unit area) ii multiplied by the ion implantation time divided by the charge on each ion. This dosage is predetermined at a high enough value to cause a desired wavelength shift. The dosage for InGaAsP/InP materials can, for example, be larger than $1 \times 10^{12}$ cm$^{-2}$ and smaller than $1 \times 10^{16}$ cm$^{-2}$. The ions species introduced can be a deep-level species or a shallow-level species.

For the purpose of illustration, two sets of samples were used in an experiment. Five pieces of sample (i.e., pieces A–E) from one of these two sets were implanted with As atoms using a 360 keV arsenic (As) ion beam. The ion implantations were performed with the samples held at an elevated temperature of $T_{implant}=220\pm20°$ C. The ion implantations were carried out with ion dosages of $1 \times 10^{12}$ cm$^{-2}$ (piece A), $1 \times 10^{13}$ cm$^{-2}$ (piece B), $5 \times 10^{13}$ cm$^{-2}$ (piece C), $1 \times 10^{14}$ cm$^{-2}$ (piece D), and $5 \times 10^{14}$ cm$^{-2}$ (piece E), which corresponds to peak crystal site vacancy concentrations of $2 \times 10^{20}$ cm$^{-3}$ (piece A), $2 \times 10^{21}$ cm$^{-3}$ (piece B), $1 \times 10^{22}$ cm$^{-3}$ (piece C), $2 \times 10^{22}$ cm$^{-3}$ (piece D) and $1 \times 10^{23}$ cm$^{-3}$ (piece E), respectively.

The implantation time $t_{implant}$ is dependent on the implantation current density and the implantation dosage and ranges from a few seconds to many hours. The implantation heating time $t_{implant-heat}$ equals the entire period of the implantation. With the relatively low ion implantation energy of 360 keV, the ions are implanted to a depth of $D_{ion}=0.2$ microns away from the wafer surface, which is far away (i.e., more than 0.5 microns away) from the quantum well structure (i.e. $D_{ion-well}>0.5$ microns). The sample was tilted to an angle of 7° during ion implantations to minimize ion channeling and to improve the controllability and the spatial resolution of the bandgap engineering process. This is achieved by mounting the sample on a titled stage, adjusted to an angle theta of 7° with the ion beam.

In order to compare with samples implanted without in-situ heating, the other set of the two sets of samples were implanted using similar ion implantation conditions, except that they were implanted at room temperature. This resulted in five pieces of comparison samples, referred to as pieces A'–E'. The ion implantations were carried out with ion dosages of $1 \times 10^{12}$ cm$^{-2}$ (piece A'), $1 \times 10^{13}$ cm$^{-2}$ (piece B'), $5 \times 10^{13}$ cm$^{-2}$ (piece C'), $1 \times 10^{14}$ cm$^{-2}$ (piece D'), and $5 \times 10^{14}$ cm$^{-2}$ (piece E'), which corresponds to peak vacancy concentrations of $2 \times 10^{20}$ cm$^{-3}$ (piece A'), $2 \times 10^{21}$ cm$^{-3}$ (piece B'), $1 \times 10^{22}$ cm$^{-3}$ (piece C'), $2 \times 10^{22}$ cm$^{-3}$ (piece D') and $1 \times 10^{23}$ cm$^{-3}$ (piece E'), respectively.

(Step 4) Thermal Annealing using RTP

After ion implantation, the samples were subjected to thermal annealing in order to initiate the QWI. The thermal annealing was performed using a rapid thermal processor (RTP) in a nitrogen atmosphere. Before the thermal annealing, the samples were deposited with a 200 nm thick SiO$_2$ layer using plasma enhanced chemical vapor deposition (PECVD). This SiO$_2$ layer acts as "annealing cap" to protect the semiconductor surface from being deplete with Group V elements during the high temperature annealing process.

In an RTP thermal annealing chamber, the samples were placed face down on a piece of fresh GaAs and another piece of GaAs was placed over the back of the samples to provide As overpressure during annealing, hence further protecting the sample surfaces by minimizing the outdiffusion of As and P from the semiconductor. An annealing temperature of $T_{anneal}=650°$ C., for $t_{anneal}=90$ seconds was used. In the RTP heating process $t_{init}$ is only a few seconds and $t_{cooling}$ achieves a significant temperature drop by more than 100° C., also within a few seconds.

Photoluminescence (PL) measurements performed at 77 degrees Kelvin measured the wavelength shift after the entire process. It was observed that samples implanted at elevated sample temperatures had a significant wavelength shift after a threshold crystal site vacancy concentration of $1 \times 10^{21}$ cm$^{-3}$. The degree of QWI saturated at a crystal site vacancy concentration of $1 \times 10^{23}$ cm$^{-3}$. Samples implanted at room temperature, however, showed insignificant wavelength shifts across the range of crystal site vacancy concentration studied in this experiment.

This first exemplary embodiment illustrates the case where the in-situ sample heating is performed with low ion implantation energy. The in-situ sample heating drives the point defects towards the QW structure, which enables the subsequent QWI to occur at a low ion implantation dose and energy. The low implantation energy helps to further reduce the formation of complex crystal defects that can cause damage to the active layer.

The above described experiment indicates that indirect-well implantation does not work well without in-situ heating, especially for the case of deeply-located quantum well structures. The reason that indirect-well implantation does not work well without in-situ heating is that the complex defects formed at the ion-implanted region prevent point defects from migrating to the QW structure during thermal annealing. Hence, in-situ sample heating performed with indirect-well implantation increases the distance the QW structure can be placed close from the surface by reducing the formation of complex defects that can block the migration of point defects to the QW structure during the thermal annealing step. In-situ heating also helps to further migrate point defects away from the wafer surface and towards the QW structure before the thermal annealing step.

B. Second Exemplary Process Embodiment Using Direct-Well Implantation.

Steps 1, 2 and 4 for the second exemplary process are the same as for the indirect-well method of the first exemplary process embodiment. The difference between the processes is the ion introduction step described below.

(Step 3) Ion Introduction under TAIVID Direct-Well Method

In step 3 of the second exemplary process embodiment, ions are introduced to an average depth of about $D_{ion}$ from the wafer surface and at a distance of $D_{ion-QW}$ from the top of quantum well structure 1120. For the direct-well implantation considered here, $D_{ion-QW}$ is smaller than 0.5 μm.

To illustrate the second exemplary process embodiment, an undoped shallow single-quantum well (SQW) sample grown by MOCVD on a GaAs substrate was prepared. The sample consisted of a 5 nm Al$_{0.4}$Ga$_{0.6}$As QW layer sandwiched between 20 nm and 500 nm barrier material layers above and below the QW layer, respectively. The top barrier material layer was covered by a 5 nm GaAs layer to prevent the Al$_{0.4}$Ga$_{0.6}$As from oxidation and the bottom barrier was grown on top of a 500 nm GaAs buffer layer on GaAs substrate. This structure gave a photoluminescence (PL) peak at about 770 nm.

The sample was deposited with a 400 nm thick SiO$_2$ layer using PECVD and an SiO$_2$ patterned mask layer was defined therefrom on the GaAs/AlGaAs surface using photolithography and dry etching. The SiO$_2$ patterned mask layer will act as the implant mask layer, whereas the exposed region of the sample will become a bandgap tuned region. In order to introduce a high concentration of point defects into the QW layer, the peak ion concentration was introduced at the middle of the QW layer. In this study, direct-well phosphorous (P) implantation using an energy of 100 keV and an ion dose of 1×10$^{14}$ cm$^{-2}$, with a substrate temperature of either room temperature or 400° C. were used to induce QWI. During ion implantation, the sample was tilted by 7° to avoid ion channelling.

Simulation showed that 100 keV energy drove the ions to an average range of 150 nm. At this implantation energy, phosphorous ions will not penetrate into the wafer for the region blocked by the 400 nm of SiO$_2$. The SiO$_2$ patterned mask layer was stripped off using wet etching and an Si$_3$N$_4$ mask was deposited using PECVD on the sample prior to rapid thermal annealing. This Si$_3$N$_4$ layer will act as the annealing mask during the RTP step. In the RTP thermal annealing chamber, the samples were placed face down on a piece of fresh GaAs and another piece of GaAs was placed over the back of the samples to provide arsenic overpressure during annealing, hence further protecting the sample surfaces by minimizing the outdiffusion of arsenic from the semiconductor. An annealing temperature of 925° C. for 30 seconds was used in this experiment.

During high temperature annealing, the point defects generated during ion implantation will enhance interdiffusion between Al from the barrier and Ga from the QW. Such interdiffusion between the atoms of QWs and barriers, referred to as the quantum-well-intermixing (QWI) effect, will result in energy bandgap or emission wavelength shift for the QWs.

To investigate the spatial resolution of the process, micro PL spectra were taken by scanning the wafer with a spatial step of 1 μm using an excitation source. An Ar$^+$ laser operating at a wavelength of 514.5 nm, with a spot diameter of ≦1 μm was used as excitation source. A sharp transition from the quantum-well emission occurs at the interface between the implanted and un-implanted regions of the samples has been observed. The masked region gives a peak PL of similar to the as-grown region at about 770 nm, whereas the implanted section was shifted to about 730 nm. This result indicates that a resolution of better than 1 μm can be obtained by introducing the ion impurity directly in the QW structure to create the lattice site vacancy.

C. Third Exemplary Process Embodiment for Achieving a Large Wavelength (Bandgap Energy) Shift Without Gain Deterioration.

This third exemplary process embodiment illustrates a case where in-situ heating is performed on a sample to produce a laser structure with large wavelength shift and little gain deterioration. The TAIVID method is applied to shift the optical wavelength of a QW structure by up to 70 nm with QW gain deterioration of less than 50%.

A GaInAs-GaInAsP MQWs laser structure similar to that of the First Exemplary Process (Section A) was used in this experiment. Oxide stripe broad area gain-guided lasers with 500 μm length and 75 μm width were fabricated from as-grown and intermixed samples. The intermixing process was carried out by implanting the samples with 5×10$^{13}$ cm$^{-2}$ of As at 360 keV, with the samples heated to 200±20° C. during implantation, and annealed using a rapid thermal annealing at 675° C. for 60 seconds under an N$_2$ and As-overpressure ambient.

For the samples of this study, the 77 K PL peaks shifted from 1.440 μm to about 1.360 μm after QWI. The samples were then cleaved into various cavity lengths for testing. Lasers fabricated using the as-grown material had threshold current densities of 1.11 KAcm$^{-2}$ for 500 μm cavity length lasers. Spectral measurement on the lasers indicate that the lasing wavelength had shifted from 1.560 μm to about 1.490 μm, a wavelength shift of about 70 nm, similar to the result observed from the PL peak shifts.

The devices from as-grown and intermixed samples were tested for threshold current and slope efficiency. The slope efficiency data showed little change with disordering within the variability of the measurement. This indicates that the intracavity optical gain had not been changed significantly and that the internal quantum efficiency remained high, indicating a deterioration of the QW gain by less than 50% for a 70 nm wavelength shifted laser.

D. Fourth Exemplary Process Embodiment for Low-Loss Waveguides.

This exemplary embodiment illustrates the case where in-situ sample heating is performed on a sample designed for a low loss waveguide application. Extended cavity lasers, which consist of active regions integrated with passive low-loss waveguides, were fabricated to demonstrate to the integration capability of the TAIVID process, and its ability to produce low-loss waveguides.

In this exemplary embodiment, the extended cavity lasers (ECLs) were fabricated on a InGaAs-InGaAsP material with a layer structure similar to the First Exemplary Process of Section A. The bandgap of the passive waveguide layers were widened using an indirect well TAIVID process.

A 1.5 micron thick SiO$_2$ implant mask was first defined over the laser active regions, leaving gaps of between 200 and 1200 microns for the extended cavities by varying the implant mask pattern. Then 400 keV P$^{++}$ ion implantation at 200±20° C. was carried out and followed by annealing the samples at 650° C. for 120 seconds. Subsequently, the InGaAs and InGaAsP highly-doped metal contact layers over the passive sections were removed by wet-etch using H$_3$SO$_4$:H$_2$O$_2$:H$_2$O in 1:8:40 ratio. The removal of the highly doped contact layers can minimize current spreading into the passive areas and the absorption of light in these sections. The SiO$_2$ implant mask was then removed using buffered HF etch. A good surface morphology was obtained after the removal of the SiO$_2$ layer. A 300 nm thick layer of SiO$_2$ was then deposited and 30 micron stripe windows were then opened. A p-contact was then defined over the laser active sections using a lift-off technique. The sample was thinned down and the n-metal contact was deposited prior to metal contact annealing at 360° C. for 60 seconds. The devices were then cleaved to give a 500 micron long active region with the passive region of 500 microns in length.

The waveguide loss measurements for the ECLs were calculated using the formula:

$$\frac{I_{ex}}{I_{nor}} = \exp\left(\frac{\alpha_e L_e}{n \Gamma g_0 L_a}\right)$$

where $I_{ex}$ and $I_{nor}$ are the threshold currents of extended and all-active devices, $\alpha_e$ and $L_e$ are the absorption coefficient and the length of the passive cavity region, $L_a$ is the length of the active region, n is the number of quantum wells, Γ is the optical confinement factor, and $g_o$ is the gain factor. An estimated value of $n\Gamma g_o$ of 30 cm$^{-1}$ was used. The active 500 micron lasers had a threshold current of 208 mA and the extended cavity laser, with an active cavity of 500 microns and a passive waveguide of 500 microns, had a threshold current of 220 mA. From the equation above, the loss in the passive section is calculated to be 1.68 cm$^{-1}$.

F. Fifth Exemplary Process for Achieving Well-Controlled Wavelength (Bandgap Energy) Shifts and for Manufacturing Photonic Integrated Circuits.

This sixth exemplary process embodiment illustrates the case where the in-situ sample heating is performed on a sample designed to make a photonic integrated circuit that includes a plurality of devices. The TAIVID method is used in this process to shift two or more different areas on a wafer to several different emission/absorption wavelengths, resulting in a plurality of active and passive photonic devices integrated on a single substrate. The active devices include lasers, optical intensity modulators, optical phase modulators, optical switches, optical amplifiers, optical saturable absorbers, optical pulse reconditioner, optical wavelength converter, phosistors (photon transistors), variable optical attenuators, tunable filters or resonators, and optical detectors. The passive optical devices include optical waveguides, optical gratings, optical splitters, optical beam couplers, multimode interference devices, optical polarizer, optical polarization beam splitter, optical wavelength filters and optical resonators (in the form of ring, disk, or linear configurations).

Figure 9:
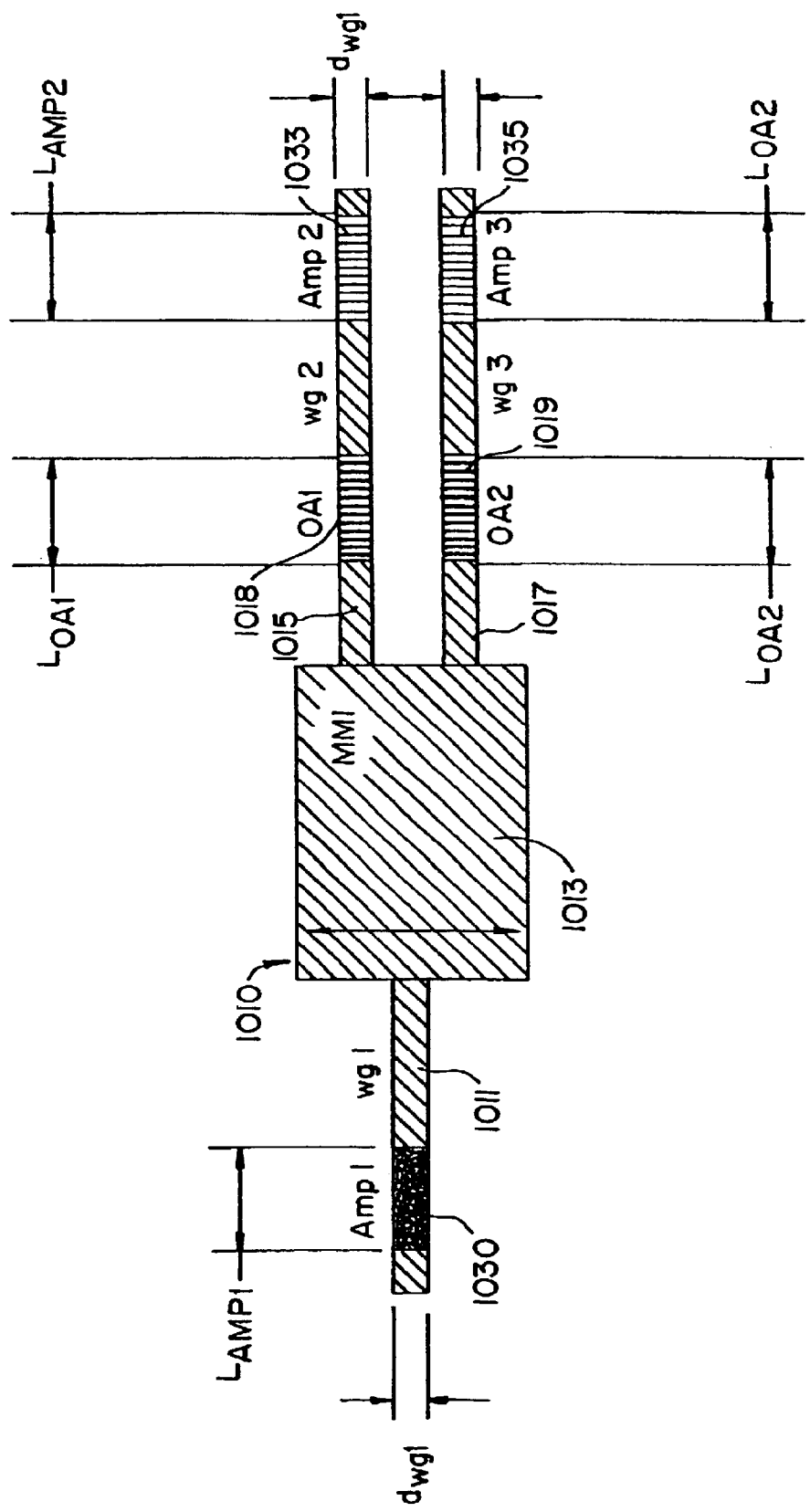
FIG. 9 depicts an exemplary photonic integrated circuit that includes a low-loss waveguide, a 1×2 multi-mode interference (MMI) couple, an optical amplifier and an optical modulator.

FIG. 9 depicts an exemplary photonic integrated circuit that includes a low-loss waveguide, a 1×2 multi-mode interference (MMI) couple, an optical amplifier and an optical modulator. This exemplary photonic integrated circuit can be used to perform a 1×2 optical switch.

In this exemplary photonic integrated circuit, the light power entering from the single mode waveguide wg1 1011 will be split into 50% portions and exists from wg2 1015 and wg3 1017 after traveling through the MMI 1013 section. Without applying a reverse bias, OA1 1018 and OA2 1019 in wg2 1015 and wg3 1017 of the 1×2 MMI optical switch are transparent to the input wavelength. Light, with power equal 50% of the input power each, will exit from wg2 1015 and wg3 1017. No light will exist from waveguide wg2 1015 if OA1 1018 is reversed bias, i.e. when the medium is absorptive. Similarly, light will be absorbed and no light will exist from wg3 1017 if OA2 1019 is reversed bias. This photonic integrated circuit can therefore serve as a 1×2 optical switch, switching the input light from one port to another by controlling the biasing conditions of the optical absorber OA1 1018 and OA2 1019. To provide gain to the optical signal, amplifiers Amp1 1030, Amp2 1033, and Amp3 1035 are integrated into the input and output waveguides respectively.

For this exemplary device, the width of the single mode waveguides wg1 1011 is dwg1=3 μm, wg2 1015 is dwg2=3 μm, and wg3 1017 is dwg3=3 μm. The lengths of the waveguides are not critical to device operations. The length of the MMI is LMMI=190 μm and its width is dMMI=8 μm. The length of OA1 1018 is LOA1=250 μm and OA2 1019 is LOA2=250 μm, and the length of the optical amplifiers Amp1 1030 is LAmp1=100 μm, Amp2 1033 is LAmp2=100 μm, and Amp3 1035 is LAmp3=100 μm. The two output arms are separated by a spacing of twg23=4 μm.

In order to provide gain to the input wavelength, the optical amplifiers should, preferably, be formed of a material with peak absorption wavelength close to the input wavelength. This implies that three bandgap energies are required for the exemplary photonic integrated circuit (PIC), i.e., optical amplifiers with bandgap energy similar to the input wavelength, passive waveguide/splitter with bandgap energy higher than the input wavelength, and a modulator with a bandgap energy between that of the optical amplifier and that of the passive splitter.

FIGS. 10A–10H illustrate steps of an exemplary fabrication process to form the three bandgap PIC of FIG. 9 using a process according to the present invention. Each of the steps of this exemplary fabrication process are described in detail below.

Step 1: Sample A of Table 2 above is deposited with a $t_d$ thick layer of dielectric D 1111, preferably, using plasma-enhanced chemical vapor deposition (PECVD) (see FIG. 12A). In the exemplary structure, $t_d$=900 nm, and the dielectric D 1111 can be, for example, $SiO_2$ (Silicon Dioxide), $Si_xN_y$ (Silicon Nitride) or $Si_x(NO)_y$ (Silicon Oxy-Nitride). The thickness of this layer is predetermined so as to totally block ions from penetrating into the sample. For this exemplary embodiment, dielectric D 1111 is taken to be $SiO_2$.

Figure 10A:
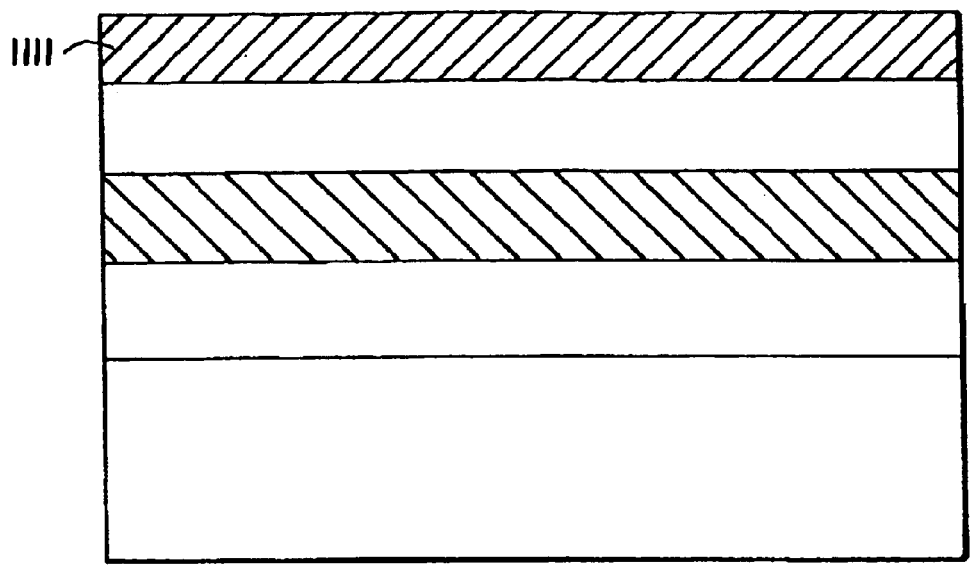
FIGS. 10A–10H illustrates an exemplary fabrication process to form the three bandgap PIC of FIG. 9 using a process according to the present invention present.
Figure 10B:
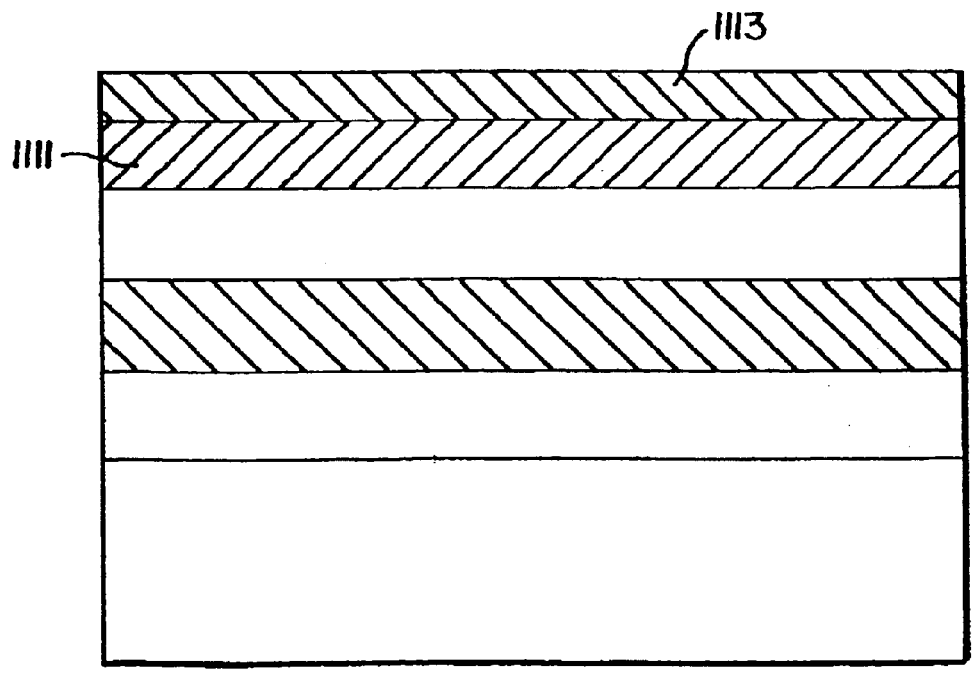
Figure 10C:
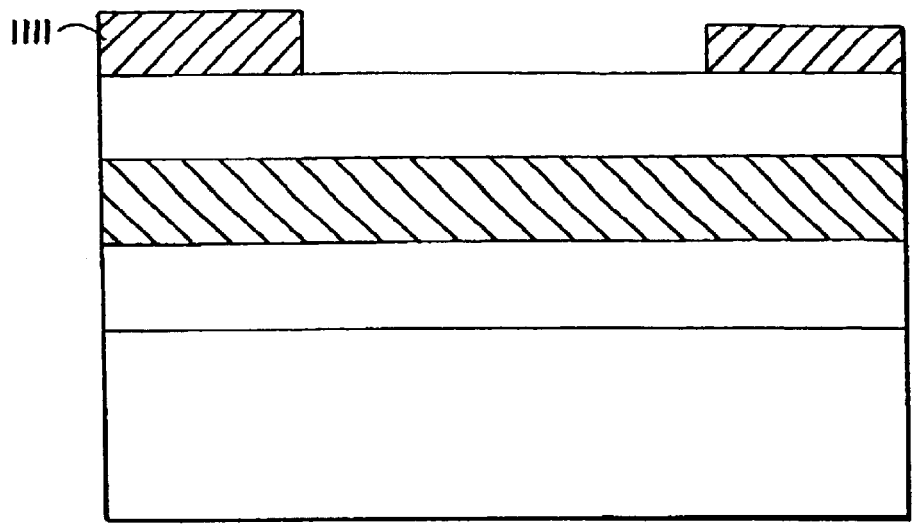

Step 2: Three different thicknesses of an $SiO_2$ mask are required to control point defect concentration and result in three different bandgaps after QWI. Three different thickness of $SiO_2$ mask can be obtained, for example, by repeating photolithography and etching process steps. To achieve this, the sample is first coated with a layer of resist 1113 and photolithography defined to provide windows where the bandgap is to be tuned (e-beam lithography can also be used). Resist 1113 acts as etch-mask to open the dielectric 1111 window by wet or dry-etching of the dielectric D 1111 layer. In this exemplary process an HF or HF-based solution can be used as wet etchant to remove the dielectric D layer 1111. Alternatively, a standard plasma etching method can be used to dry etch the $SiO_2$. FIG. 10C shows a schematic drawing of the sample after lithography, the dielectric 1111 etching, and the photoresist removal using acetone solution.

The above described lithography and the etching processes are repeated to create a patterned $SiO_2$ mask layer with different thickness on selected areas. For this exemplary embodiments, they are 0 nm on the passive waveguide and MMI regions, 500 nm on the OA1 and OA2 regions, and 900 nm on the amplifier region. The results are shown schematically in FIG. 10C, where the left side represents the regions with the resultant 900 nm thick $SiO_2$, the right side represents the regions with the resultant 500 nm thick $SiO_2$, and the middle represents the regions with the resultant 0 nm thick $SiO_2$ (i.e. without $SiO_2$).

Figure 10D:
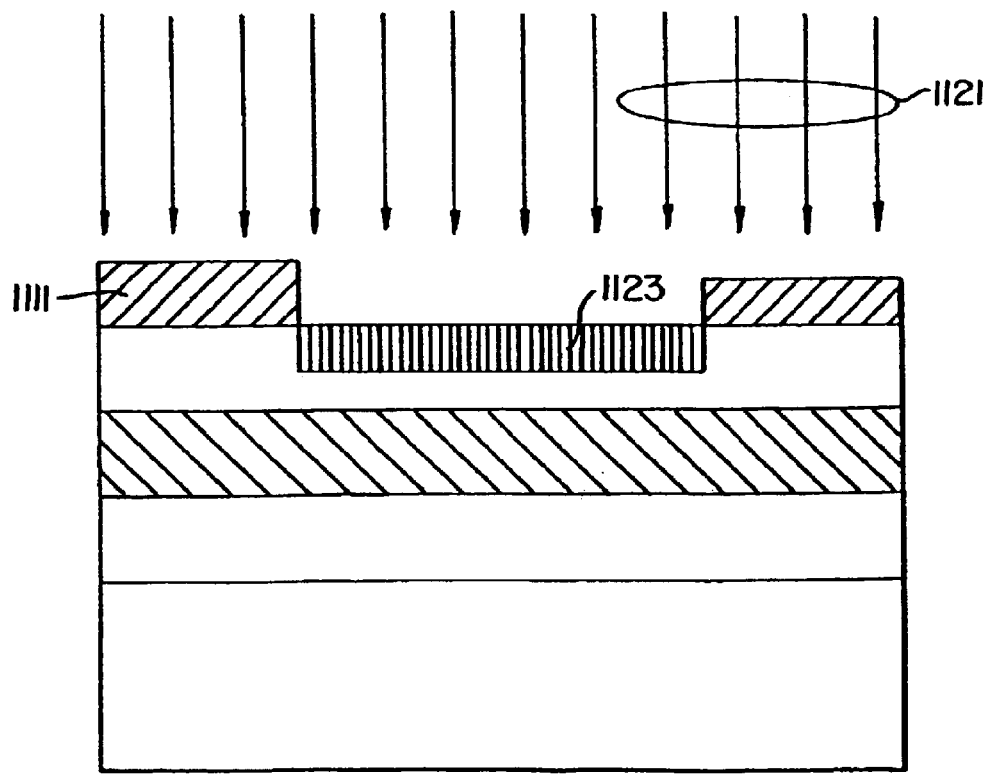

Step 4: After the $SiO_2$ mask formation, the sample is subjected to the ion implantation step (FIG. 10D). Point defects and ions are introduced into the semiconductor material by exposing it to ion flux 1121 generated by an ion implanter (FIG. 10D). The sample is thereby implanted with an impurity ion Imp using an implantation energy $E_{impt}$, implant dose $I_d$ at a sample in-situ heating temperature of $T_s$. The sample is tilted to an angle of $\theta_{impt}$ during ion implantation. Exemplary implant conditions for a low spatial resolution process are $E_{impt}$=360 keV, $I_d$=10$^{-14}$ cm$^{-2}$, and $T_s$=200° C. A shallow implanted layer 1123 will form in the semiconductor material where the windows were opened prior to ion-implantation. The regions masked with 900 nm of the dielectric layer 1111 will be protected from being damaged by the ion flux 1121 during the ion-implantation process, whereas the regions masked with 500 nm and 0 nm of the dielectric layer 1111 will be partially exposed to the implanted ions and full exposed to the implanted ions, respectively. FIG. 10D is a schematic illustration of the sample during the ion implantation process.

Figure 10E:
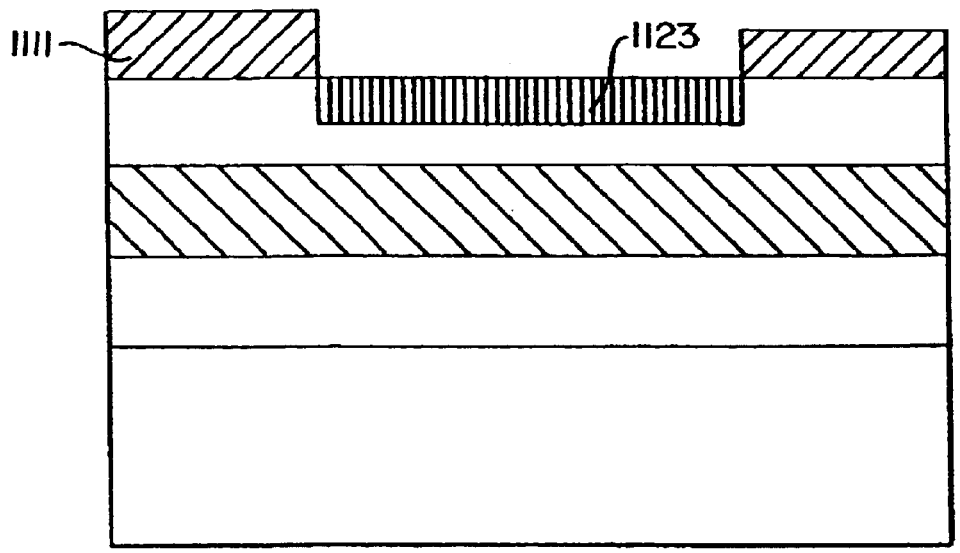
Figure 10F:
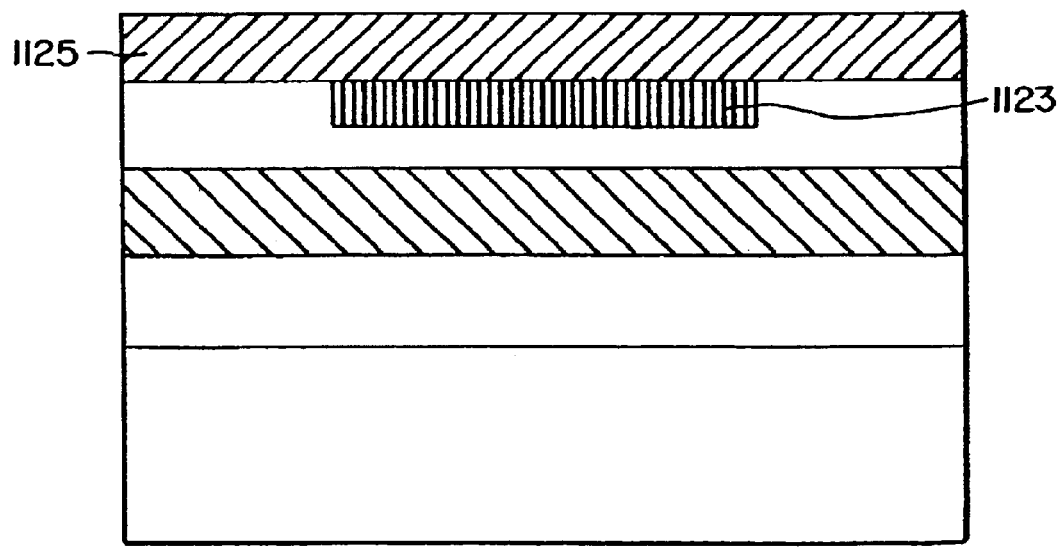

Step 5: Dielectric implant-mask 1111 is removed (FIG. 10E). A fresh layer of dielectric layer $D_2$ 1125 with thickness $t_{d2}$ is then deposited everywhere on the wafer 1150, preferably using PECVD (FIG. 10F). In this exemplary process, the preferred thickness of $D_2$ 1125 is $t_{d2}$=200 nm $SiO_2$. This layer will act as an annealing cap to minimize group V elements out-diffusion during the subsequent high temperature annealing cycle.

Step 6: A thermal annealing process step is carried out, preferably, using a rapid thermal processor (RTP) to promote QWI. The preferred purge gas for an RTP system is nitrogen. To further reduce the out-diffusion of group V elements (e.g., As and P for a III–V semiconductor material), the sample is annealed under a group V, preferable arsenic, overpressure ambient. This is achieved by sandwiching the sample between two fresh pieces of GaAs wafers. The sample is annealed at temperature $T_{rtp}$ for time $t_{rtp}$ using an RTP to bandgap tune quantum well structure 1150. In this exemplary process, the RTP conditions are $T_{rtp}=650°$ C. and $t_{rtp}=120$ s. The annealing process is, preferably, carried out at a temperature just below the thermal stability temperature of the QW structure. In the present invention, the thermal stability temperature is defined as the threshold annealing conditions (namely, temperature and time) at which no blue wavelength shift occurs in an un-implanted quantum well sample after annealing.

Figure 10G:
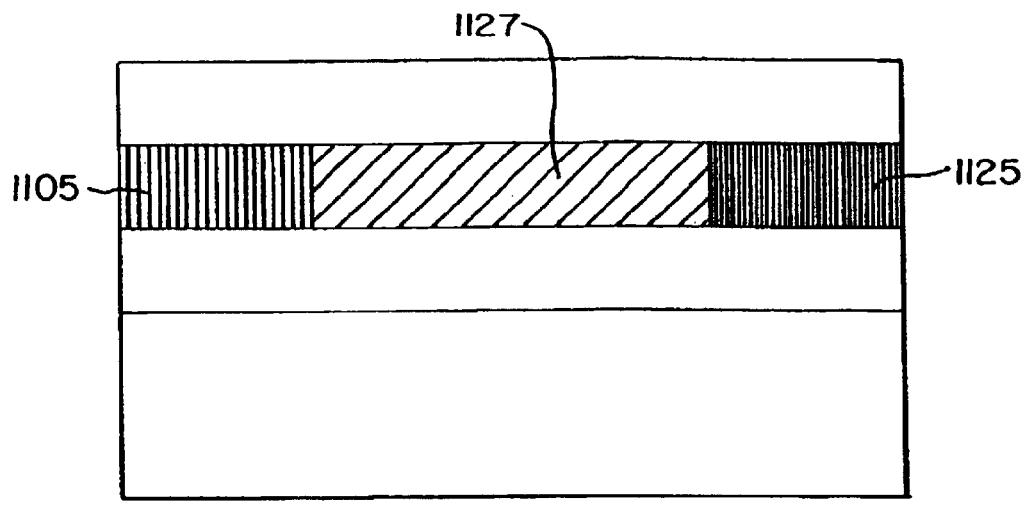
Figure 10H:
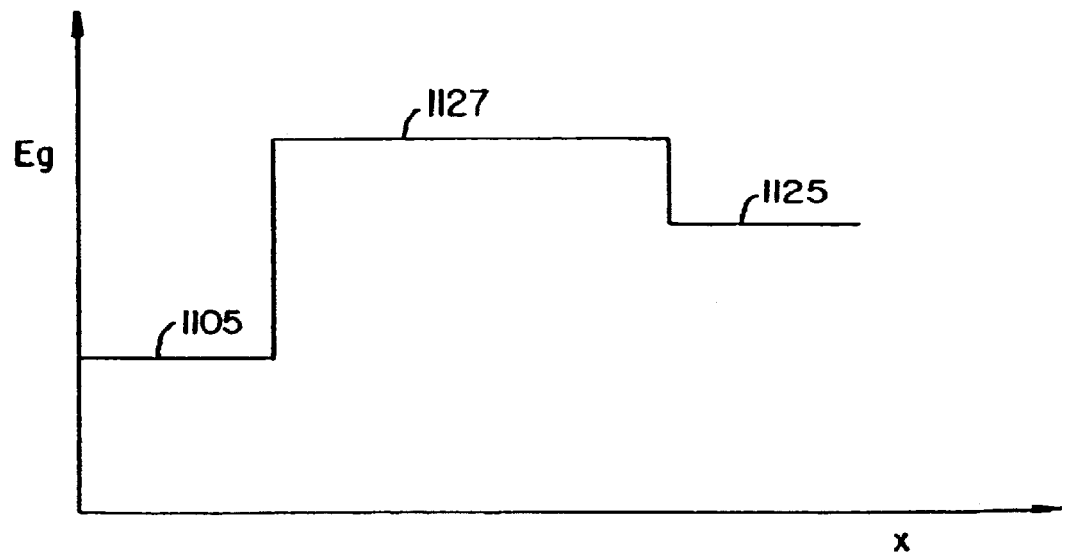

Step 7: As the degree of QWI is dependent on the ion implantation dose, multiple bandgap energies across a substrate can be obtained after a single ion implantation and annealing step using the masking technique described above. Three bandgaps, with a stepwise increase in the degree of QWI from the thickest to the thinnest $SiO_2$ patterned mask region, 1105, 1125, 1127, as illustrated in FIG. 10G, will be obtained after the QWI step. FIG. 10H is a plot illustrating the bandgap energy, Eg, as a function of position, x, for the substrate after the TAIVID process. Three distinct bandgap energies corresponding to regions with three different vacancy concentrations as illustrated in FIG. 10H will be obtained after the bandgap tuning process.

After QWI, additional processing steps that required for the fabrication of the exemplary device 1010 are summarized as follows:

(i) The $Si_3N_4$ film is removed using HF solution.

(ii) A 200 nm $SiO_2$ film is deposited.

(iii) The MMI, the optical absorber and the semiconductor optical amplifiers patterns are transferred to the $SiO_2$ film using, for example, $CF_4/O_2$ dry plasma etching.

(iv) Device patterns are subsequently transferred into the quantum well material by removing the III–V semiconductor material using a $SiCl_4$ or $Cl_2$ dry plasma etching technique. An etched depth of 1.3 $\mu$m can be used in this step.

(v) Polyimide is then deposited to planarize the wafer.

(vi) Lithography and polyimide etching (using, for example, $O_2$ plasma dry etching) is carried out to define the p-metal contact pad on the optical absorber, i.e., OA1 1018 and OA2 1019 for MMI switch 1010.

(vii) P-metal contact, e.g., Ti/Au (20 nm/2000 nm), is evaporated and lifted off.

(viii) The sample is thinned to about 80 $\mu$m using both dry and wet etching.

An N-metal contact, using Au/Ge/Au/Ni/Au (20 nm/20 nm/20 nm/20 nm/2000 nm), is then evaporated on the substrate.

The specific device dimensions described above are for the purpose of illustration purpose and not limitation as would be clear to those skilled in the art. With the above exemplary processes, it would be known to those skilled in the art that these processes can be similarly applied to integrate other quantum-well based photonic devices involving different quantum-well bandgap energies on a single wafer.

The devices are ready to be scribed into die for testing and packaging after a metal annealing step at 360° C. for 60 seconds using an RTP.

It should be understood that various alternatives to the embodiments of the invention described herein may be employed in practicing the invention. It is intended that the following claims define the scope of the invention and that methods and structures within the scope of these claims and their equivalents be covered thereby.

What is claimed is:

1. A method for shifting the bandgap energy of a quantum well layer comprising:

introducing ions into a quantum well structure at an elevated temperature that is in the range of from about 200° C. to near the crystal damage temperature, wherein the introduced ions are selected from a group consisting of oxygen, gallium, fluorine, nitrogen, boron, argon, arsenic, xenon and phosphorus; and wherein the quantum well structure is formed over a substrate and includes at least:

an upper barrier layer;

a lower barrier layer; and a quantum well layer disposed between the upper barrier layer and the lower barrier layer; and wherein the ions are introduced no closer than 0.5 microns from the upper and lower barrier layers; and thermally annealing the quantum well structure;

wherein quantum well interdiffusion is induced and the bandgap energy of the quantum well layer is shifted.

2. The method of claim 1, wherein the introducing step creates crystal site vacancies in the quantum well structure at a concentration below $6 \times 10^{19}$ cm$^{-3}$.

3. The method of claim 1 further comprising, during the introducing step, introducing ions into a quantum well structure that includes:

a III–V material upper barrier layer;

a III–V material lower barrier layer; and a III–V material quantum well layer.

4. The method of claim 3 further comprising, during the introducing step, introducing ions into a quantum well structure that includes:

an InGaAsP upper barrier layer;

an InGaAsP lower barrier layer; and an InGaAs quantum well layer.

5. The method of claim 3 further comprising, during the introducing step, introducing ions into a quantum well structure that includes:

an InGaAsP upper barrier layer;

an InGaAsP lower barrier layer; and an InGaAsP quantum well layer.

6. The method of claim 3 further comprising, during the introducing step, introducing ions into a quantum well structure that includes:

an InP upper barrier layer;

an InP lower barrier layer; and an InGaAsP quantum well layer.

7. The method of claim 3 further comprising, during the introducing step, introducing ions into a quantum well structure that includes:

an InP upper barrier layer;

an InP lower barrier layer; and an InGaAs quantum well layer.

8. The method of claim 3 further comprising, during the introducing step, introducing impurity ions into a quantum well structure that comprises:

an AlGaAs upper barrier layer;

an AlGaAs lower barrier layer; and a GaAs material quantum well layer.

9. The method of claim 3 further comprising, during the introducing step, introducing ions into a quantum well structure that includes:

an AlGaAsP upper barrier layer;
an AlGaAsP lower barrier layer; and
an AlGaAsP quantum well layer.

10. The method of claim 1 further comprising, during the introducing step, introducing ions into a laser waveguide quantum well structure.

11. The method of claim 1 wherein:
the quantum well structure further includes an upper cladding layer disposed above the upper barrier layer; and
the introducing step includes introducing the ions into the upper cladding layer.

12. The method of claim 1 wherein:
the quantum well structure further includes an upper cladding layer disposed above the upper barrier layer; and
the introducing step includes introducing the ions into the upper cladding layer such that the impurity ions are at least 0.5 micron from the upper barrier layer.

13. The method of claim 1, wherein the thermally annealing step is conducted at a temperature above 450° C. for a time period in the range of about 2 seconds to about 3 minutes.

14. The method of claim 13, wherein the thermally annealing step is conducted at a temperature above 600° C., and wherein the quantum well structure contains InP.

15. The method of claim 14, wherein the thermally annealing step is conducted at a temperature above 700° C., and wherein the quantum well structure contains GaAs.

16. The method of claim 1, wherein the introducing step employs an ion implantation technique.

17. The method of claim 1, wherein the introducing step employs an implantation dosage of greater than $1 \times 10^{12}$ $cm^{-2}$.

18. The method of claim 16, wherein the introducing step employs an implantation energy of no more than 400 KeV.

19. The method of claim 1, wherein the thermally annealing step induces a bandgap energy shift of at least 60 meV.

20. The method of claim 1 further comprising, after the introducing step and before the thermal annealing step, depositing a capping layer on an upper surface of the quantum well structure.

21. The method of claim 1, wherein the quantum well structure further includes a layer doped with a high mobility impurity and is back-spaced by at least 0.1 $\mu$m from at least one of the quantum well layer, the upper barrier layer and the lower barrier layer.

22. The method of claim 1, wherein the introducing step employs a focused ion beam.

23. The method of claim 1, wherein the introducing step employs a dense ion plasma.

24. The method of claim 1, further comprising the step of:
forming a patterned mask layer over the quantum well structure;
wherein the implanting step includes implanting the ions into a predetermined portion of the quantum well structure, at a temperature in the range of from about 200° C. to about 700° C., using the patterned mask layer as an implant mask; and
wherein the quantum well interdiffusion is induced and the bandgap energy of the predetermined portion of the quantum well layer is shifted.

25. The method of claim 24, wherein the forming step forms an $SiO_2$ patterned stress-inducing mask layer.

26. The method of claim 24, wherein the forming step forms a patterned stress-inducing mask layer on a substrate that includes the quantum well structure and wherein the patterned stress-inducing mask layer is formed of a material with a thermal coefficient of expansion that is at least 10 times different than the thermal coefficient of expansion of the substrate.

27. The method of claim 26, wherein quantum well intermixing is induced with a spatial resolution of less than 3 microns.

28. The method of claim 24, wherein the quantum well interdiffusion is induced and the bandgap energy of the predetermined portion of the quantum well structure is shifted with a spatial resolution of less than 3 microns.

29. The method of claim 26, further comprising, during the forming step, forming the patterned mask layer that includes a plurality of patterned mask layer portions, each of the plurality of patterned mask layer portions having a thickness that is different than the thickness of the other patterned mask layer portions, and during the implanting step, implanting ions into predetermined portions of the quantum well structure using the patterned mask layer to control the penetration of ions into the predetermined portions of the quantum well structure.

30. A method for shifting the bandgap energy of a quantum well layer comprising:
introducing ions into a quantum well structure at an elevated temperature and with an implant energy of no more than 400 KeV, wherein the quantum well structure is formed over a substrate and includes at least:
an upper barrier layer;
a lower barrier layer; and
a quantum well layer disposed between the upper barrier layer and the lower barrier layer;
wherein the ions are introduced no closer than 0.5 microns from the upper and lower barrier layers; and
thermally annealing of the quantum well structure to induce quantum well interdiffusion that shifts a bandgap energy of the quantum well layer.

31. The method of claim 30 further comprising the step of:
forming a stress-inducing patterned mask layer on the quantum well structure before the introduction of the ions, wherein the patterned stress-inducing mask layer is formed of a material with a thermal coefficient of expansion that is at least 10 times different than the thermal coefficient of expansion of the substrate.

32. The method of claim 31, wherein the stress-inducing patterned mask layer includes a plurality of patterned mask layer portions, each of the plurality of patterned mask layer portions having a thickness that is different than the thickness of the other patterned mask layer portions, and during the implanting step, the ions are implanted into predetermined portions of the quantum well structure using the patterned mask layer to control the penetration of ions into the predetermined portions of the quantum well structure.

33. The method of claim 1, wherein the ions are introduced into predetermined portions of the quantum well structure with different dosages and/or different implant energies to vary the bandgap energy shifts induced therein by the quantum well interdiffusion.

34. The method of claim 33, wherein:
the bandgap shift for one of the quantum well structure predetermined portions is selected to form a passive optical device; and
the bandgap shift for another one of the quantum well structure predetermined portions is selected to form an active optical device.

35. The method of claim 34, wherein the passive optical device is an optical waveguide or a multi-mode interference couple, and the active optical device is an optical modulator or an optical amplifier.

36. The method of claim 35, wherein the quantum well structure predetermined portions form an optical switch, with optical waveguides connecting a plurality of optical amplifiers to a multi-mode interference couple.

* * * * *